United States Patent [19]

Chang et al.

[11] Patent Number: 5,295,082
[45] Date of Patent: Mar. 15, 1994

[54] EFFICIENT METHOD FOR MULTICHIP MODULE INTERCONNECT

[75] Inventors: Kou-Chuan Chang, Renton; Christopher A. Young, Redmond, both of Wash.

[73] Assignee: The Boeing Company, Seattle, Wash.

[21] Appl. No.: 708,055

[22] Filed: May 30, 1991

Related U.S. Application Data

[63] Continuation-in-part of Ser. No. 438,325, Nov. 16, 1989, abandoned, which is a continuation-in-part of Ser. No. 314,817, Feb. 22, 1989, abandoned.

[51] Int. Cl.$^5$ ............................................. G06F 15/60
[52] U.S. Cl. ................................... 364/490; 364/489; 364/488
[58] Field of Search ................ 364/488, 489, 490, 491; 357/70, 71, 81; 361/414, 386

[56] References Cited

U.S. PATENT DOCUMENTS

| | | |
|---|---|---|
| 4,245,273 | 1/1981 | Feinberg et al. ........................ 361/382 |
| 4,458,297 | 7/1984 | Stopper et al. ........................ 361/403 |
| 4,631,686 | 12/1986 | Ikawa et al. ............................ 364/490 |
| 4,811,237 | 3/1989 | Putatunda et al. ...................... 364/491 |
| 4,831,725 | 5/1989 | Dunham et al. ........................ 29/847 |
| 4,956,749 | 9/1990 | Chang .................................... 361/414 |
| 5,067,004 | 11/1991 | Marshall et al. ........................ 357/71 |
| 5,182,632 | 1/1993 | Bechtel et al. .......................... 257/713 |

OTHER PUBLICATIONS

Hudson, Jack A., et al., "Rectilinear Area Routing: A Channel Router Approach," Copyright 1985, IEEE, pp. 468–471.
Dai, H. et al., "An Automatic Routing System for General Cell VLSI Circuits," Proceedings of the IEEE 1985 Custom Integrated Circuits Conference, The Portland Hilton, Portland, Oregon, May 20–23, 1985, pp. 68–71.
Hiwatashi, T. et al., "A Hierarchical Routing System for VLSIs Including Large Macros", Proceedings of the IEEE 1986 Custom Integrated Circuits Conference, Rochester Riverside Convention Center, Genesee Plaza-Holiday Inn, Rochester, New York, May 12–15, 1986, pp. 285–288.
Hsu, C-P., "A New Two-Dimensional Routing Algorithm," IEEE 19th Design Automation Conference, pp. 46–50.

Primary Examiner—Vincent N. Trans
Attorney, Agent, or Firm—Christensen, O'Connor, Johnson & Kindness

[57] ABSTRACT

A method for interconnecting integrated circuits (ICs) mounted on a multichip module so as to minimize spacing between the ICs and maximize their density. A multichip module (20,80) includes a plurality of ICs (22,82) that are mounted on a substrate (24,84). The ICs are electrically connected to pads (28), spaced apart from each other and offset from the boundaries of the ICs to define vertical routing channels (35) and horizontal routing channels (42). The horizontal routing channel includes a top routing channel (36), a bottom routing channel (38), and a central routing channel (40). Initially, a minimal number of tracks are provided in the central routing channel. Each pad has an electrical connection point or pin (44,46) associated with it and the pins are organized into nets. The method provides for dividing the nets into two pin subnets. Each subnet in the horizontal routing channel is assigned to a vertical track so as to minimize violation of a constraint graph. Horizontal tracks are assigned to the subnets so as to minimize an associated element in a COST matrix of subnets and tracks. The method uses a conventional maze router approach to connect pins in subnets not otherwise connected. If any subnet then still remains unconnected, an additional track is added to the central routing channel and the steps of method are then repeated. Use of the top and bottom routing channels reduces the need for routing interconnections through the central routing channel and thus allows the ICs to be mounted more closely together.

21 Claims, 14 Drawing Sheets

EFFICIENT METHOD FOR MULTICHIP MODULE INTERCONNECT

RELATED APPLICATIONS

This application is a continuation-in-part of U.S. patent application Ser. No. 438,325, filed Nov. 16, 1989, which in turn is a continuation-in-part of U.S. patent application Ser. No. 314,817, filed Feb. 22, 1989, both now abandoned, the benefit of the filing dates of which are hereby claimed under 35 U.S.C. Section 120.

TECHNICAL FIELD

This invention generally pertains to a method for routing electrical interconnects of a circuit, and specifically, to a method for determining assignment of conductive paths to interconnect integrated circuits (ICs) on a multichip module.

BACKGROUND OF THE INVENTION

Printed circuit boards include discrete components, which are interconnected with copper (or other conductive) traces that are photolithographically applied to the board on which the components are mounted. The traces on the printed circuit board can be laid out manually, or if more complex, multi-level boards are involved, may be routed using a computer. Analogously, large ICs, which include hundreds or thousands of components that must be interconnected using conductive traces applied to an underlying substrate are normally far too complex to be routed manually. The conductive traces are usually defined in at least two layers, including vertical traces in one layer and horizontal traces in another, which can be electrically connected at designated points using vias that extend between the layers. To define a conductive path between two points on the substrate, a computer routing program is normally employed. The program selects portions of the vertical and horizontal conductive traces that will most efficiently (i.e., using the shortest route) provide the required interconnection without interfering with or short circuiting other interconnections that have already been assigned. As necessary, the program lays out "jogged" or "dogleg" paths to accomplish this goal.

Interconnection of ICs in a multichip module presents a new level of difficulty. A multichip module is a substrate on which the ICs are attached by wire bonding or tape automated bonding (TAB) techniques. By attaching a plurality of ICs to a common substrate in this manner, higher system performance, lower weight, and smaller size can be achieved than is possible with traditional printed circuit boards on which discrete ICs are mounted. Since the number of interconnections often is in the thousands, manual routing of conductive interconnections is virtually impossible. Traditional computer assisted circuit board routing techniques would use the area under the ICs for laying out connection paths; however, in multichip modules, the ICs must be mounted directly onto the substrate to insure good thermal conductivity and the underlying area is not available to form layers in which conductive traces can be formed. Thus, the ICs are mounted in spaced apart array directly onto the substrate, and only part of the areas between the ICs are typically used for routing channels.

Input and output terminals on the boundaries of each IC comprising a multichip module are connected by very thin wires to conductive pads using the wire bonding or tape automated bonding operations. The pads are generally aligned with and spaced apart from each side of the ICs. In routing interconnections between these pads on a multichip module according to prior art methods, only the areas between the pads of adjacent ICs have been used for routing channels; the areas between the boundaries of each IC and its associated pads (each such area comprising a strip at least 50 mils wide) have not been used for interconnection of the pads and have thus been wasted. Commonly assigned U.S. patent application Ser. No. 314,817, filed Feb. 22, 1989 describes the use of these previously wasted areas, referred to as side channels, for interconnecting pads. Ideally, the conventional (central) routing channel, which comprises only the area between the pads of adjacent ICs, should be as narrow as possible to allow the maximum number of chips to be mounted on a given size substrate. Conventional routing methods are not equipped to handle routing of interconnects through the side channels and can only be used if the area between the pads and the IC boundaries can be wasted, i.e., where the density of ICs mounted on the multichip module is not an important concern.

Accordingly, it is an object of the present invention to provide a method for interconnecting a plurality of ICs in a multichip module so as to maximize chip density on the module. It is a further object of the invention to preferentially interconnect pads on a multichip module using side routing channels that are disposed between the boundaries of the ICs mounted on a substrate and pads to which the ICs are electrically connected. A still further object is to minimize the width of a central routing channel defined between the pads of adjacent ICs comprising a multichip module. These and other objects and advantages of the present invention will be apparent from the attached drawings and from the Description of the Preferred Embodiments that follows.

SUMMARY OF THE INVENTION

In accordance with the present invention, a method is provided for electrically interconnecting a plurality of ICs that are attached to a substrate, forming a multichip module. The ICs are interconnected by conductive traces defined in a plurality of layers applied to the substrate outside boundaries of the ICs, and the conductive traces extend along generally orthogonal vertical and horizontal tracks in different layers. Each IC has a plurality of terminals that are electrically connected to a corresponding plurality of pads disposed in a spaced apart array outside the boundaries of that IC. Routing channels between the ICs include variable width central routing channels defined between the pads of adjacent ICs, and side routing channels defined between the pads and the boundaries of the ICs. The method is applied to interconnect the pads of the plurality of ICs so as to minimize the width of the central routing channels and includes the following steps.

The first step calls for defining a plurality of pins to be electrically interconnected, where each pin comprises a point on one of the pads. Next, a plurality of nets are defined, each net comprising the pins that are to be electrically interconnected. Each net is then divided into a plurality of two-pin subnets. For each routing channel that is horizontally oriented, by moving horizontally in a preferred direction to successive vertical tracks, a specific horizontal track is assigned to each subnet that has one pin that vertical track and another pin in a vertical track that is offset in the preferred direction. During this step, preference is given to assigning horizontal tracks in the side routing channels, so as to minimize violations of the following constraints. First, subnets of different nets that lie along a common vertical track can not lie in overlapping horizontal tracks. Second, subnets of different nets that lie along a common vertical track can not overlap along that common vertical track. For subnets including pins that can not be interconnected without violating these two constraints, either the position of one of the pins is modified to avoid violation of the constraints or the pins of such subnets are interconnected using additional horizontal and vertical tracks to form a jogged (or dogleg) path, subject to the further constraint that the assignment of horizontal and vertical tracks to interconnect these pins is accomplished using a minimum number of additional horizontal and vertical tracks.

Thereafter, the multichip module is logically oriented so that the horizontal tracks are treated as vertical tracks and the vertical tracks are treated as horizontal tracks. The steps of the method set forth above are then repeated, starting with the step following dividing each net into a plurality of two-pin subnets, but the logical orientation now causes the vertical tracks and the horizontal tracks to be effectively interchanged.

A crossover region is defined where two orthogonal routing channels cross. The crossover region includes boundary pins aligned generally horizontally along opposite edges of one of the two routing channels where it crosses the other routing channel. The method further includes the step of temporarily assigning a vertical track aligned with one of the boundary pins to each subnet passing over the boundary pins. In one preferred form of the invention, after the step of logically orienting the multichip module, each subnet having the temporarily assigned vertical track that is aligned with one of the boundary pins retains its previously assigned horizontal track, but is subject to reassignment to a different track through another boundary pin, in accordance with the steps of the method.

A cost is associated with each horizontal track that can be assigned to each subnet, based upon the conformance of the assignment to the constraints noted above. The step of assigning the horizontal track comprises the step of selecting the horizontal track that minimizes the cost.

Where assigning horizontal tracks to the subnets cannot be accomplished without violating the two constraints, the method includes the step of shifting pins disposed within the crossover region horizontally to avoid overlap of vertical tracks for subnets of different nets. In addition, this step of assigning can then include the step of shifting pins that are disposed in the crossover region and that are vertically aligned to avoid overlap of horizontal tracks assigned to subnets of different nets. Further, this step of assigning can include the step of positioning the pads so that the side routing channels overlap between adjacent ICs.

The method can also include the step of alternating the preferred direction in first one direction, and then in an opposite direction, so that the sequence of vertical tracks extends first in the one direction and then in the opposite direction. In this manner, a total track length required for interconnection of the pins comprising at least some of the subnets can be achieved.

After the step of assigning horizontal tracks to the subnets in accordance with the two constraints, any remaining subnets are interconnected after reassigning subnets already connected to avoid conflicts. Alternatively, a maze routing procedure can be used to interconnect pins not already interconnected.

DESCRIPTION OF THE PREFERRED EMBODIMENTS

Figure 1:
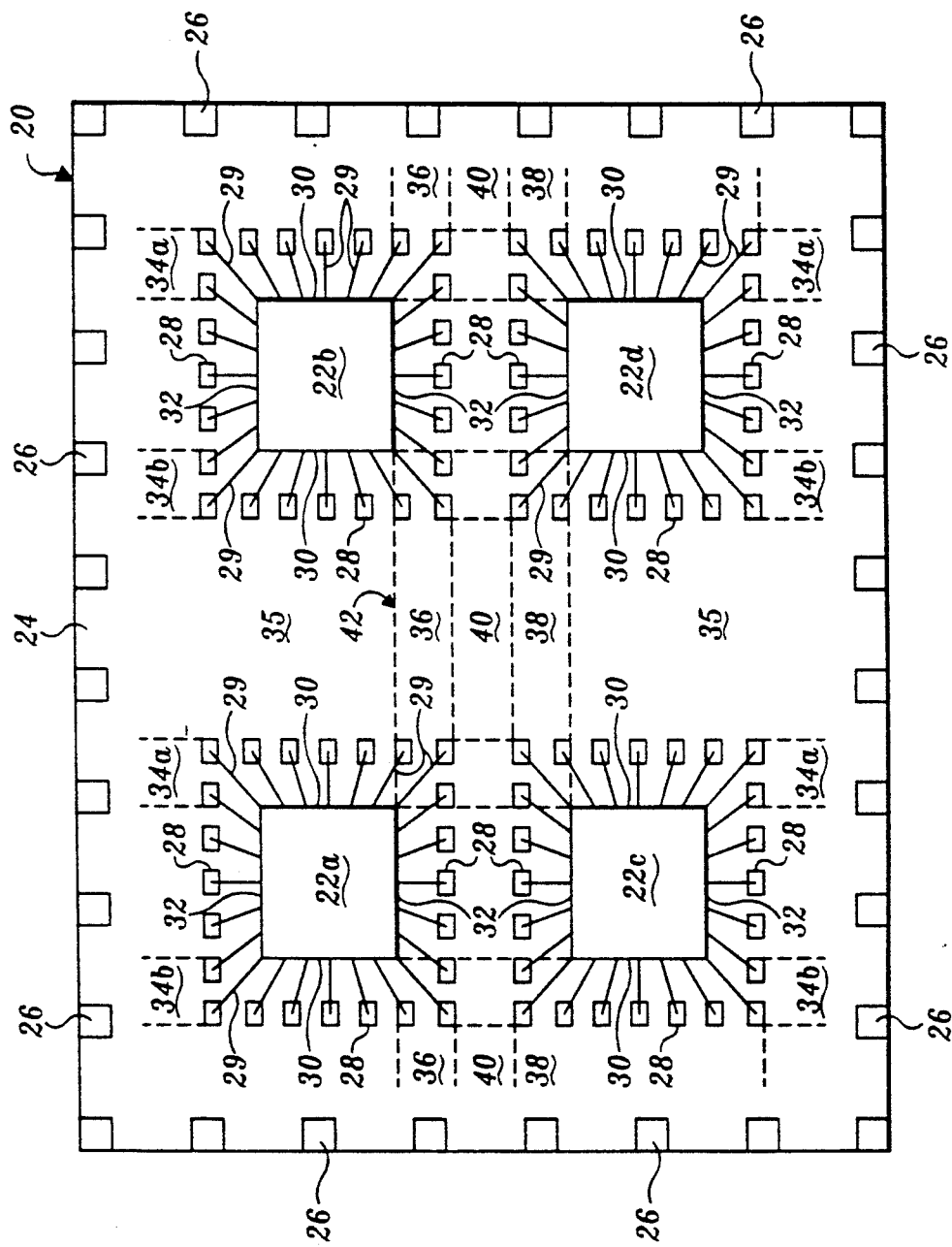
FIG. 1 is a schematic plan view of a relatively simple multichip module on which are mounted four ICs that are interconnected in accordance with the present invention.

In FIG. 1, a relatively simplified multichip module 20 is illustrated in which four ICs 22a, 22b, 22c, and 22d are mounted directly on a substrate 24. As noted above in the Background of the Invention, each IC is directly bonded to substrate 24 to improve heat transfer between the IC and the substrate. Consequently, conductive traces usable for interconnection in the multichip module cannot run underneath any IC. Substrate 24 typically comprises a generally planar slab of silicon or gallium arsenide.

Multichip module 20 includes a plurality of edge connections 26, which are spaced apart around the periphery of the multichip module to enable the multichip module to be electrically connected in any electrical circuit (not shown) in which the multichip module is installed. The functions provided by ICs 22a, 22b, 22c, and 22d may be the same or entirely different, depending upon the nature of the ICs and the multichip module. However, the internal operation and construction of ICs 22 are not pertinent to the present invention. Access to the internal circuitry within each IC 22 is provided for interconnection in multichip module 20 by a plurality of spaced-apart pads 28 that surround each IC and are offset from the edges of each of the ICs. A plurality of very fine fly wires extend radially outward from ICs 22 and are bonded to pads 28, providing an electrical path for signals to flow between the pads and the internal circuitry of the ICs.

The edges of each IC 22 are defined as vertical boundaries 30 and horizontal boundaries 32, in respect to the view shown in FIG. 1. It will be apparent that the terms "vertical" and "horizontal" as used herein are relative terms, depending upon how the multichip module is viewed, since rotation of the multichip module through 90 degrees effectively reverses these terms in respect to the view of the multichip module. The designation of horizontal or vertical is thus arbitrary as used in the present method for routing multichip 20, as will be apparent from the following description.

As previously discussed in the Background of the Invention, a conventional prior art method for routing multichip module 20 would use only the areas between pads 28 of adjacent ICs 22 for laying down both horizontal and vertical tracks (not shown in FIG. 1) comprising conductive traces defined within a polymer insulating layer (also not shown) applied to substrate 24. Thus, the conventional approach for routing the multichip module would waste the areas between pads 28 and both vertical boundaries 30 and horizontal boundaries 32 of each IC 22. With existing technology, the areas between the pads and the boundaries of the ICs are at least 50 mils wide, and thus constitute a substantial total region that is not used in conventional channel routing methods. Space on substrate 24 comprises valuable "real estate," which a designer cannot afford to waste if the number of ICs 22 mounted on the multichip module is to be maximized. Although conventional channel routing techniques can readily be applied to route interconnections through the space between pads 28, such methods are not applicable to using the space between the pads and boundaries 30 and 32 of ICs 22. The present method for routing these interconnections overcomes this limitation, enabling ICs 22 to be mounted on substrate 24 much more closely spaced apart than would otherwise be possible if conventional channel routing methods were used, by minimizing the area between the pads that is required for routing interconnections. Thus, the present invention permits higher IC density in a multichip module than prior art channel routing methods.

Accordingly, multichip module 20 includes a horizontal routing channel 42 and a vertical routing channel 35. Horizontal routing channel 42 comprises a top routing channel 36, which is disposed between pads 28 and lower horizontal boundary 32 of IC 22a and 22b, a central routing channel 40, which (within routing channel 42) would be exclusively used for routing in prior art methods for interconnecting pads 28, and a bottom routing channel 38, between pads 28 and top horizontal boundary 32 of ICs 22c and 22d. Similarly, vertical routing channel 35 includes side channels 34a and 34b, which are disposed between pads 28 and vertical boundaries 30, on the right and left sides of the ICs.

In the first embodiment of the present method of routing interconnects, all connections to pads 28 that are disposed within each horizontal routing channel on the multichip module are initially routed. Horizontal routing channel 42 is exemplary of other horizontal routing channels in respect to the initial orientation of the multichip module. Thus, interconnections within other horizontal routing channels on the multichip module are routed in a similar manner. After all of the horizontal channels are routed, the multichip module is logically reoriented so that the previous horizontal routing channels become vertical routing channels, and the previous vertical routing channels become horizontal routing channels. The method then proceeds to route the remainder of interconnections between pads 28 of the ICs comprising the multichip module, in respect to the "new" horizontal routing channels.

Those of ordinary skill in the art will appreciate that vertical routing channel 35 and horizontal routing channel 42 comprise at least two layers of orthogonal conductive traces or tracks that are used for interconnecting ICs 22. Additional layers, for example, layers used for power and ground connections, are sometimes also provided, but are not specifically discussed here, in order to simplify this disclosure. The tracks in one layer run vertically, while those in the other layer extend horizontally. Signals and power are conveyed between the layers at vias, disposed where a vertical track and a horizontal track are electrically linked together. The horizontal and vertical tracks extend through points referred to as "pins." Since pads 28 are physically larger in size (typically greater than 2 mils on a side) than the distance between adjacent vertical or horizontal tracks, each pin representing the electrical connection point at one of the pads 28 can be shifted to different horizontal or vertical tracks within the area encompassed by the pad. Thus, each pin represents the specific spatial disposition of either a horizontal or vertical track upon substrate 24, and generally represents a point of electrical connection to the track.

As shown in the view of the crossover region of vertical routing channel 35 and horizontal routing channel 42 (FIG. 2), the pins through which the vertical and horizontal tracks extend are divided into three types. Internal pins 44 are disposed generally between adjacent ICs 22a and 22c, and between adjacent ICs 22b and 22d, spaced apart horizontally within horizontal routing channel 42. Each internal pin 44 is associated with one of the pads 28. Top routing channel 36 extends between lower boundary 32 of ICs 22a and 22b and the adjacent internal pins 44. Similarly, bottom routing channel 38 extends between the top horizontal boundary 32 of ICs 22c and 22d and their associated adjacent internal pins 44.

Figure 2:
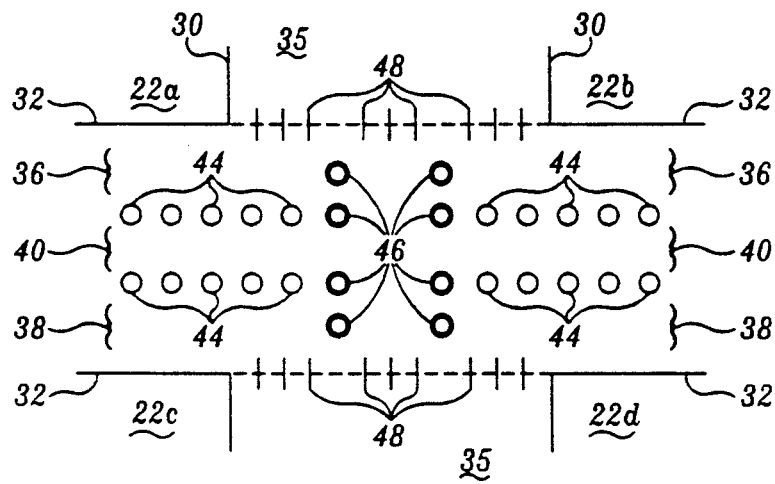
FIG. 2 schematically illustrates a portion of a horizontal routing channel and crossover area in respect to a vertical routing channel on the multichip module shown in FIG. 1.

The second type of pins shown in FIG. 2 are vertical pins 46, which are spaced apart vertically within vertical routing channel 35 (i.e., in the crossover region), and which are each electrically connected to one of the pads 28 that are vertically aligned within vertical routing channel 35.

Boundary pins 48 (represented by vertical line segments in FIG. 2) are horizontally spaced apart and disposed generally in alignment with horizontal boundaries 32 of ICs 22, but are spaced apart across vertical routing channel 35, each one lying on a vertical track within the span of vertical routing channel 35.

The size of top routing channel 36 and bottom routing channel 38, in terms of the number of horizontal tracks that are defined therein is generally fixed, based upon the minimum offset between the boundaries of ICs 22 and pads 28. However, the size (measured vertically) of central routing channel 40 is variable, in terms of the number of horizontal tracks that can be formed therein. The present invention minimizes the number of horizontal tracks in central routing channel 40 by using top routing channel 36 and bottom routing channel 38 for interconnecting internal pins 44 and vertical pins 46. Each horizontal or vertical track requires approximately 1 mil of space (measured transversely to the track), which corresponds to the routing pitch, i.e., the sum of the track width and a minimum distance between two adjacent tracks. The present invention minimizes the size of central routing channel 40 by initially assigning only a limited number of horizontal tracks to it, and thereafter making optimum use of top routing channel 36 and bottom routing channel 38 for interconnecting internal pins 44 and vertical pins 46.

Figure 12:
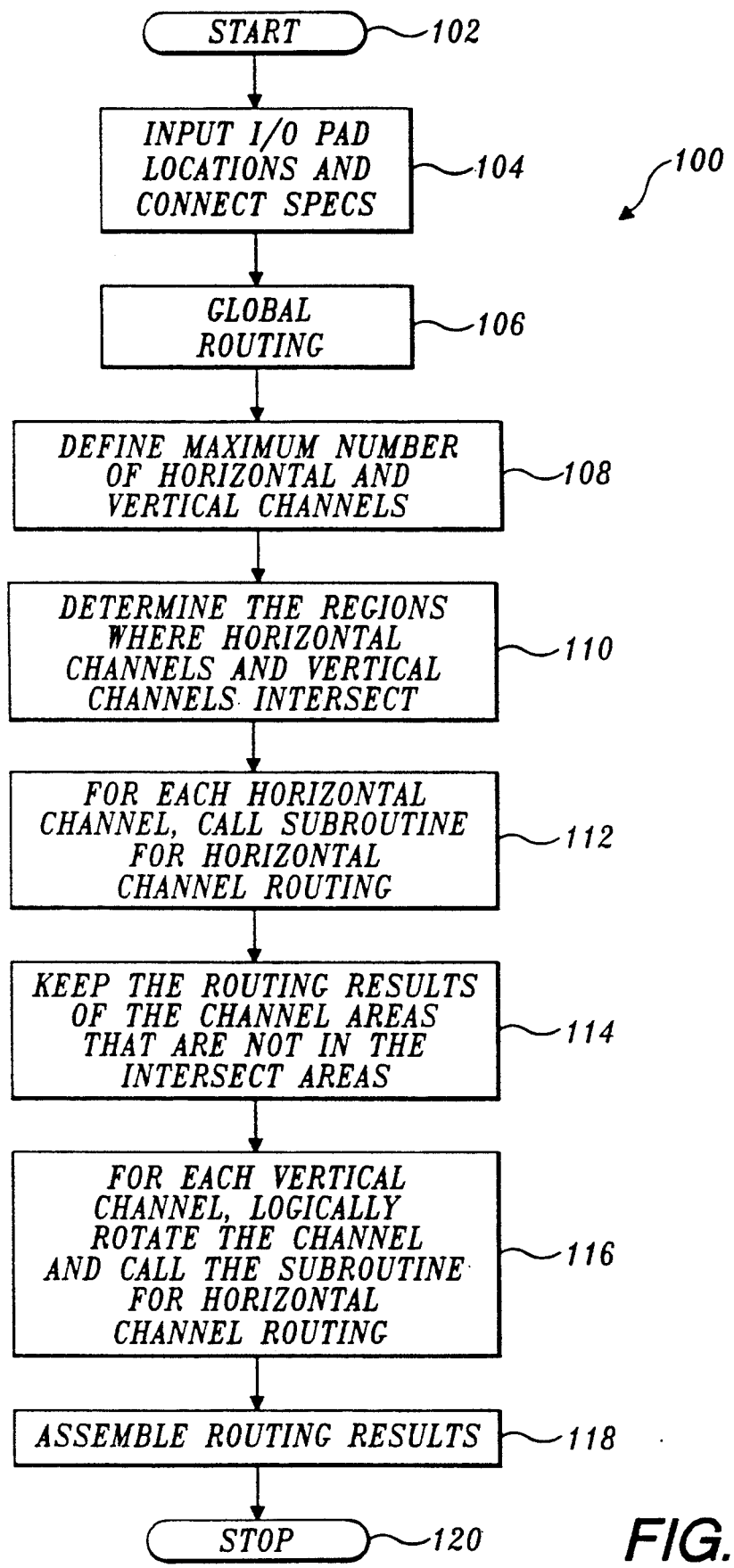
FIG. 12 is a flow chart of a main program implementing the routing method in accordance with a first embodiment of the present invention.

Turning now to FIG. 12, a flow chart illustrating a main routine for carrying out the steps of a first embodiment of the routing method is illustrated generally at reference numeral 100. Main routine 100 begins at a start block 102. Following start block 102, a block 104 provides for the loading of input/output (I/O) pad locations, which are defined in terms of their coordinates on substrate 24, and data defining the pads that are to be interconnected in nets. For purposes of this specification and the claims that follow, a net comprises all of the pins that are to be interconnected in common.

In a block 106, a conventional global routing technique is applied to determine the horizontal and vertical routing channels that will be used for interconnecting specific pins in each net. Generally, this global routing technique provides for using the shortest route to interconnect pins in each net. A block 108 then provides for determining the total number of horizontal and vertical routing channels to be routed. Then, in a block 110, main routine 100 determines crossover regions where the horizontal and vertical routing channels intersect.

A block 112 calls a subroutine for horizontal channel routing, for each horizontal routing channel. After nets in all of the horizontal routing channels have been routed by successive passes through the subroutine, a block 114 insures that the tracks assigned by the routing process are retained for the portions of each horizontal routing channel that are not in a crossover region; however, track assignments in the crossover regions can be changed during routing of interconnections in the current vertical routing channels. A block 116 logically rotates the channels, i.e., logically rotates multichip module 20, so that the horizontal routing channels now become vertical routing channels, and the vertical routing channels now become horizontal routing channels.

After the logical rotation in block 116, the subroutine for horizontal channel routing is again called, and each of the previously vertical routing channels are now processed as horizontal routing channels. After the last routing channel has thus been routed, a block 118 provides for assembling the routing results for the overall multichip module by compiling the routing data for the original horizontal routing channels and the results from processing the previous vertical routing channels as horizontal routing channels. Main routine 100 terminates at a block 120.

The majority of the steps carried out in implementing the routing method of this invention are performed in a channel routing subroutine 130 shown in FIGS. 13 and 13A through 13C. The subroutine begins at a start block 132, which is followed by a block 134 in which all variables are initialized. The subroutine specifically deals with routing internal pins 44 and vertical pins 46 (as shown in FIG. 2) within a single routing channel such as horizontal routing channel 42. In a block 136, each net of electrically interconnected pins within the horizontal routing channel, comprising N pins in total, are split into N−1, two-pin subnets using the minimum spanning tree algorithm, which is well known to those of ordinary skill in this art. The "Manhattan" distance between the two pins comprising each subnet is then determined, i.e., the sum of the horizontal and vertical distances between the two pins is determined.

Figure 3:
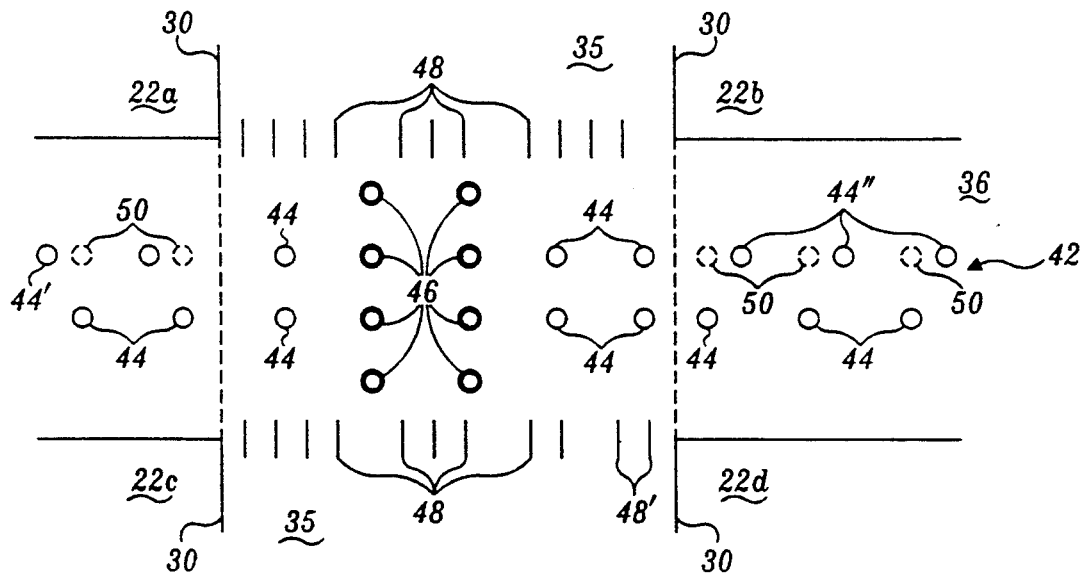
FIG. 3 schematically illustrates how internal pins that are outside a span of top and bottom boundary pins within the horizontal routing channel of FIG. 2 are shifted left or right to improve access for routing connections to the pins.

In a block 146, a series of iterative loops are initiated that operate on the internal pins in each vertical track within the channel being routed. Each of these loops includes a determination in a decision block 148 of whether the internal pins in a given vertical track are in the same net. If not, a block 150 provides for shifting the top internal pin left or right. Thereafter, the logic returns to repeat the loop initiated in block 146 for the next internal pin in a vertical track. Block 146 specifically excludes internal pins that lie within the span of boundary pins 48 (between vertical boundaries 30) within vertical routing channel 35, as represented by internal pins 44 that are between the two vertical dash lines in FIG. 3. As indicated in FIG. 3, internal pins 44 lying within the crossing of vertical routing channel 35 and horizontal routing channel 42 are not shifted left or right even if not in the same net. However, internal pins 44', which are outside the span of vertical channel 35 are shifted left out of alignment with pins 44. Dashed circles 50 represent the previous aligned positions of pins 44 prior to their being shifted left. Similarly, pins 44'' are shifted right, from positions of previous alignment 50 in respect to corresponding pins 44, which are not in the same net. Even though pins 44' and 44'' are respectively shifted left and right in respect to their previous positions 50, they are still in electrical contact with the same pads 28, since pads 28 are sufficiently large in size to encompass different dispositions of the internal pins. By shifting internal pins 44' and 44'' left and right by one track, respectively, these pins can be more readily accessed by vertical tracks that do not interfere with connections to other internal pins 44.

Figure 4:
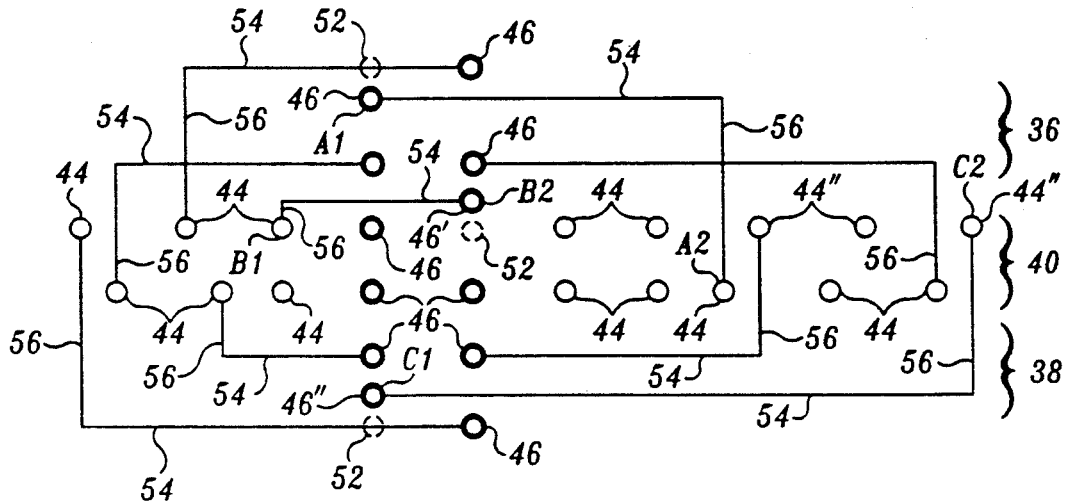
FIG. 4 schematically illustrates the shifting of vertical pins up or down in respect to the crossover section of the horizontal routing channel shown in FIG. 2.

If the internal pins in any vertical track are in the same net, none of the internal pins are shifted; in a block 152, the loop moves to the next vertical track within the routing channel being processed and repeats the loop initiated in block 146. After all vertical tracks in the routing channel are considered, the logic proceeds with a block 154. In block 154, another repetitive loop is initiated that successively checks each vertical pin disposed within the crossover region of vertical routing channel 35 and horizontal routing channel 42. Specifically, in a decision block 156, a determination is made as to whether each subnet connected to a top or bottom vertical pin is also connected to another pin in the same horizontal track as that top or bottom vertical pin. If so, decision block 156 branches to a block 158 which provides for shifting the top or bottom vertical pin up or down one horizontal track, so that it is closer to the center of top routing channel 36 (in the case of a vertical pin within the top routing channel), or closer to the center of bottom routing channel 38 (in the case of a vertical pin within the bottom routing channel). The step implemented in block 158 is illustrated in FIG. 4, wherein for simplicity, the horizontal and vertical boundaries of ICs 22 have been omitted. In FIG. 4, a vertical pin 46' is shown shifted downwardly toward the center of top routing channel 36, from its previous position, as indicated by a dashed circle 52, which was in alignment with another vertical pin 46. Another pin 46' is shifted upwardly toward the center of the top routing channel.

Horizontal tracks 54 and vertical tracks 56 are illustrated in FIG. 4 to show how each of the vertical pins 46 and 46' might be connected to corresponding internal pins 44 and 44' following the shift of vertical pins implemented in block 158. Similarly, vertical pins 46'' are shown, which have been shifted upwardly toward the center of bottom routing channel 38 from a previous position 52 in alignment with another vertical pin 46. At the top of FIG. 4, one vertical pin 46 is connected, for example, to one of the internal pins 44 by a horizontal track 54 and a vertical track 56. In this Figure, it should be apparent that as a result of its being shifted vertically, a pin 46' designated A1 is thus more readily connected to the internal pin 44 designated A2, thereby avoiding interference with the horizontal track connecting the two other pins. Similarly, one of the internal pins 44 designated B1 is more readily connected using vertical track 56 and horizontal track 54 to shifted vertical pin 46', designated B2, without passing through another unrelated vertical pin. Likewise, a vertical pin 46'' which is designated C1 is more readily connected to an internal pin 44''', designated C2 by being shifted vertically upward. In each case, by shifting these vertical pins upwardly or downwardly (and the internal pins left or right), interference with the connection of other internal or vertical pins not in the same net is avoided. Shifting vertical pins 46' and 46'' upwardly or downwardly by a small incremental amount does not alter their connection to the pads 28 to which they previously were connected, due to the relatively large area of the pad.

If two vertically pins lying in the same horizontal track are in the same net, they are not shifted vertically upwardly or downwardly. In a block 160, the next vertical pin within the horizontal track under consideration is selected before iteratively repeating the loop initiated by block 154. Finally, after all vertical pins have been thus checked and shifted as appropriate, channel routing subroutine 130 proceeds to a block 162, shown in FIG. 13A.

In block 162, a vertical constraint graph G(V,E) is developed that defines the relative order of horizontal tracks 54 for each subnet within the routing channel under consideration, where V represents the set of all subnets having a pin within the routing channel being processed, and E is the set of directed edges. An edge (V1, V2) is in set E if a subnet V1 has a pin that is vertically above a pin of subnet V2 and there is no other pin between them. The constraint (V1, V2) defines the relative sequential order for the horizontal track used by subnet V1 and that used by subnet V2, indicating that the horizontal track for subnet V1 is spatially vertically above the horizontal track for subnet V2. Thus constraint graph G(V,E) defines the relative order of horizontal tracks assigned to corresponding subnets. In developing the constraint graph, the horizontal tracks for boundary pins and internal pins are considered first. It is quite possible that constraint graph G(V,E) contains cycles in the ordering of the horizontal tracks, so that the order cannot be defined without violating a constraint. Such cycles are broken by choosing not to consider the vertical constraint in respect to tracks with the lowest "cost." The cost of a vertical track is the sum of the numbers of pins in the left or right immediately adjacent vertical tracks. A lower cost associated with a vertical track means that the pins in that vertical track can be connected easily (i.e., without interference) with those in a neighboring adjacent vertical track. After the constraints for horizontal tracks associated with the internal and boundary pins are determined, constraints for horizontal tracks associated with the vertical pins are added to constraint graph G(V,E), so long as they do not introduce cycles.

Figure 5:
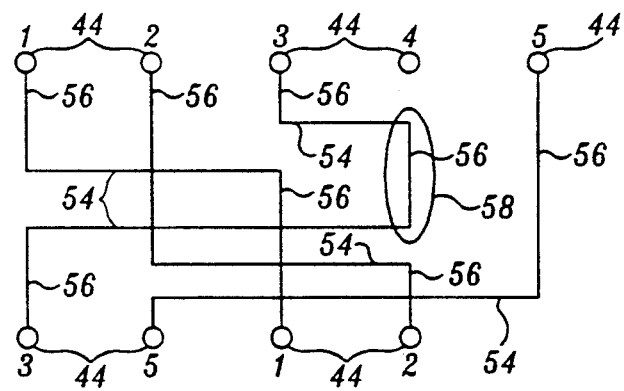
FIG. 5 schematically illustrates an unused vertical track (that extends through an internal pin not requiring interconnection) that facilitates connection of other internal pins.

FIG. 5 illustrates a plurality of internal pins 44 that are interconnected with vertical tracks 56 and horizontal tracks 54. These internal pins are in subnets designated 1 through 5 in sequential order from left to right along the top of FIG. 5, and are connected as correspondingly numbered (in regard to the subnets) internal pins 44, which are shown at the bottom of the Figure. There is no pin in use at the subnet position designated by 4. In developing a constraint graph for this simplistic example, the four subnets would be in the sequential order 1, 2, 5, 3, cycling back to 1. To break the cycle, an adjacent vertical track lying under position 4 is used. The vertical track through position 4 has the lowest cost, since it is not in use. Accordingly, the number of pins on that vertical track through position 4 is one, compared to the two pins along the vertical track running through subnet position 2, at the other immediately adjacent vertical track. The cycle is thus broken by connecting subnet 3 with a jog over to the vertical track through the adjacent neighboring vertical track having the lowest cost, i.e., the vertical track through position 4.

Referring back to FIG. 13A, in a block 164, the method provides for assigning two numbers to each subnet. The first number, FROM_The_TOP corresponds to the number of levels from the top of the constraint graph of the horizontal track for that subnet. Similarly, the value FROM_THE_BOTTOM corresponds to the number of levels of the horizontal track associated with a subnet, counting from the bottom of the constraint graph. Another value, TOTAL_LEVEL represents the total number of levels in the constraint graph. These values are used in subsequent steps.

In a block 166, the type designation of each subnet is defined according to the following rules: a boundary pin 46, which is disposed at the top of the crossover region of horizontal routing channel is assigned a type number 11; top vertical pins are assigned a type number 12; top internal pins are assigned a type number 13; bottom internal pins are assigned a type number 21;

bottom vertical pins are assigned a type number 22; bottom boundary pins (within the crossover region of the horizontal and vertical rou$ channels) are assigned a type number 23; left boundary pins (within vertical side channel 34a) are assigned a type number 1; and right boundary pins (within vertical side channels 34b) are assigned a type number 2. Thus, each subnet within the horizontal routing channel has associated with it a subnet type that depends upon the type number of the two pins comprising the subnet. To develop the subnet type, the first pin type is multiplied times 100 and added to the second pin type. For example, a subnet type 1122 includes a first top boundary pin and a second bottom vertical pin.

In a block 168, a BEST_TRACK is determined for each subnet, corresponding to the best or preferred horizontal track for that subnet. In this respect, each of the horizontal tracks are numbered, starting at 1 on the bottom of the horizontal routing channel, and ranging to a maximum (equal to NUM_TRACKS) at the top of the horizontal routing channel. The BEST_TRACK is assigned to each subnet, based upon its type, according to the following rules:

(1) subnet type 1111—since this type subnet has both pins disposed at the top boundary, its BEST_TRACK value is set to the horizontal track extending through the top boundary, which is equal to NUM_TRACKS;

(2) subnet type 2323—since this type of subnet has both pins at the bottom boundary, its BEST_TRACK value is set to 1, corresponding to the horizontal track extending through or adjacent to the bottom boundary pins;

(3) subnet type 1313—in this type subnet, both pins are top internal pins, and accordingly, BEST_TRACK is set to a horizontal track that extends through one of the two pins comprising the subnet;

(4) subnet type 2121—in this type subnet, both pins are bottom internal pins and BEST_TRACK is set to the horizontal track running through at least one of the two internal pins 44, comprising the subnet;

(5) subnet types XX12, 12XX, XX22, and 22XX—each of these type subnets has at least one vertical pin and BEST_TRACK is set to the horizontal track in which that vertical pin is disposed; however, if both pins are vertical tracks, BEST_TRACK is set to the horizontal track of the vertical pin that is closest to the middle of either the top routing channel or the bottom routing channel;

(6) subnet of any other type—BEST_TRACK is set such that:

BEST_TRACK = TOTAL_NUM_TRACKS
(TOTAL_LEVEL_LEVEL_FROM_
THE_TOP)/TOTAL_LEVEL.  (1)

In the above Equation (1), the value for BEST_TRACK is thus determined based upon the relative position of the subnet within the constraint graph, expressed as a fraction of the total number of tracks available.

Once $BEST_{13}$ TRACK is determined according to the above rules, in a block 170, the BEST_TRACK value is assigned to each subnet. This value is used in further defining the horizontal tracks used for interconnecting the two pins comprising each subnet as explained below.

In a block 172, each element of a matrix defining the COST (I,J) for each subnet I in respect to each track J is initialized to zero. The rows of the matrix correspond to the available subnets that must be routed and the columns of the matrix correspond to the various horizontal tracks within the routing channel being processed. Then, in a block 174, for each subnet S, the element of the matrix COST (S, BEST_TRACK) is set to an arbitrary integer LOW. In the preferred form of this method, LOW is set equal to one. (Similarly, other arbitrary values are defined, for use as noted below, including MED equal 80, HIGH equal 6400, and INFINITE equal $2^{16}$). The purpose of block 174 is to ensure that each element of the cost matrix corresponding to the track determined to be the BEST_TRACK for a given subnet is initially set to an arbitrarily low value, indicating that for that subnet, the track designated BEST_TRACK is preferred. Accordingly, in a decision block 176, for any track that is not designated to the BEST_RACK in respect to a subnet S, the element COST (S,T) is assigned the value LOW plus the absolute value of |T−BEST_TRACK|. However, if the track in question in the COST matrix is equal to the BEST_TRACK, an inquiry block 180 determines if the track T includes a pin or any other blockage in the horizontal span of subnet S. In the event that such a blockage exists, COST (S,T) is set equal to its previous value plus the variable HIGH. Thereafter (or otherwise, immediately following decision block 180), a decision block 184 determines if track T is outside of the access range of a pin in subnet S. The access range of a pin is defined as a set of continuous horizontal tracks bounded by (T,B) such that the pin can be connected with a vertical track to any horizontal track K if $T \geq K \geq B$, without shorting to another subnet. Assuming that the track is outside the access range, a block 186 sets COST (S,T) equal to the previous value of that element of the matrix plus the variable MED, which is arbitrarily defined to provide a medium cost associated with that element. Thereafter (or immediately following a negative result to the inquiry in block 184), the subroutine proceeds with a block 188 that determines:

$$\sum_{J=1}^{NUM\_TRACKS} COST(S, J) \qquad (2)$$

for all tracks, and for each subnet S. Block 188 thus provides for determining the sum of all costs associated with the tracks in each row (subnet) of the COST matrix.

In a block 190, all of the subnets in the routing channel being processed are divided into a first set that includes a vertical pin and a second set that does not. Thereafter, in a block 192, the set of subnets that includes a vertical pin is selected; and in a decision block 194, a determination is made as to whether the pins comprising a subnet in that set can be connected with a vertical track. If so, the logic proceeds to a block 196. In block 196, starting with subnet having the largest total Σ COST (S,J), the subnet is assigned to a track T, such that the COST (S,T) is a minimum among COST (S,J), for J=1, NUM_TRACKS. In other words, subnet S is assigned to a horizontal track T that has the lowest cost. The same logic is applied in assigning horizontal tracks to each of the other subnets, working toward the subnets with successively smaller total Σ COSTS (S,J).

In a decision block 198, a determination is made as to whether any subnet R is in the same net as a subnet S, and if so, in a block 200, COST (R,T) is set equal to the previous COST (R,T) minus SUB (where SUB is a predefined variable having a value 5 in the preferred form of this method). This adjustment to COST (R,T) encourages subnet R to be assigned to horizontal track T, which saves a via, since subnets S & R then can share a pin, being in the same net.

In respect to decision block 194, if the two pins comprising a subnet cannot be connected with a vertical track, a decision block 202 determines if a vertical pin in the subnet can be connected to a horizontal track T. If so, the logic proceeds to block 200, which was described above. Otherwise, a decision block 204 determines if a subnet R is in the same net as subnet S. This inquiry is analogous to decision block 198. If the answer to the inquiry is affirmative, the logic again proceeds to block 200. Otherwise, a block 206 assigns a value COST (R,V) equal to the previous value of COST (R,V) plus MED, where MED is the arbitrary value noted above and V is a horizontal track that runs through the vertical pin comprising the subnet. The step in block 206 thus biases the cost associated with a subnet comprising a vertical pin that cannot be connected to track T, by adding the arbitrary value MED to the previous cost for that subnet (for any subnet R in respect to a horizontal track V on which the vertical pin in subnet R resides), if subnet R is not in the same net as subnet S. By providing this biasing value to the cost of subnet R, a conventional maze routing technique that may subsequently be applied is more likely to make an interconnection between the pins comprising the subnet, since other subnets are forced to use tracks other than V, so that the vertical pin comprising subnet R can later be connected with track V.

Following decision block 206 (or after a negative result from decision block 198), the logic proceeds to a decision block 208. In this decision block, a determination is made as to whether the span of subnet S overlaps the span of subnet R. An affirmative response to this inquiry implies that subnet S and subnet R, which are not of the same net, overlap and therefore are shorted—a condition that cannot be allowed. Accordingly, block 210 sets the value for COST (R,T) equal to INFINITE. Block 210 thus effectively deletes subnet R from the set, since the value of INFINITE is so large that track T will never be assigned to subnet R.

Following block 210 (or immediately following a negative result from decision block 208), a decision block 212 determines whether all subnets in the set with a vertical pin have been considered. If not, a block 215 selects the next such subnet and returns to decision block 194. As the logic again loops down through block 196, subnets with successively smaller total cost (S,J) are considered until all subnets in the set of subnets with a vertical pin have been considered. Thereafter, an affirmative result to decision block 212 leads to an inquiry in a decision block 214 that determines if all subnets in the set without a vertical pin have been considered. Since, initially, none of the subnets in this set have yet been considered, the subroutine proceeds with a block 216 that selects the set of subnets without a vertical pin and again repetitively loops through block 196 and each of the subsequent blocks discussed above.

Figure 6:
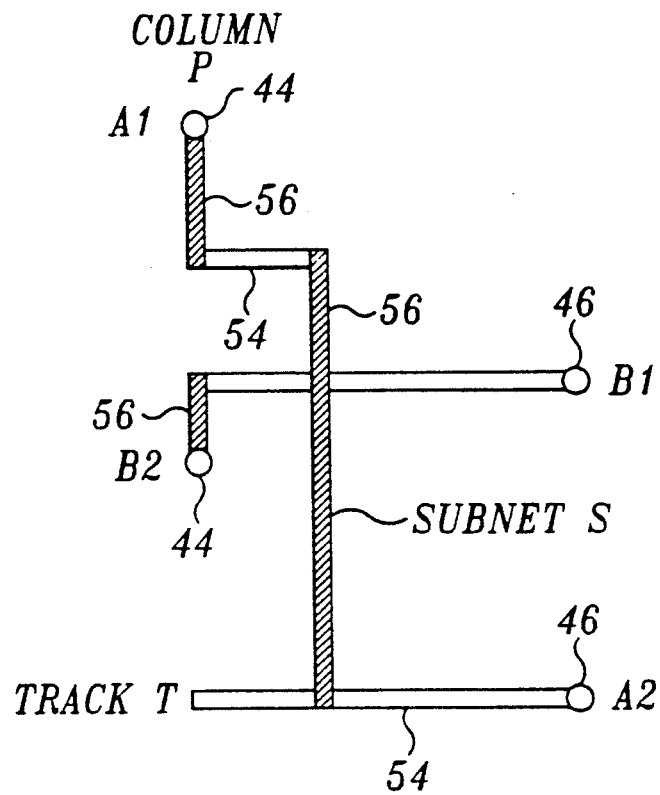
FIG. 6 is a schematic illustration of a "one jog" or "dogleg" interconnection of two pins comprising a subnet.
Figure 7:
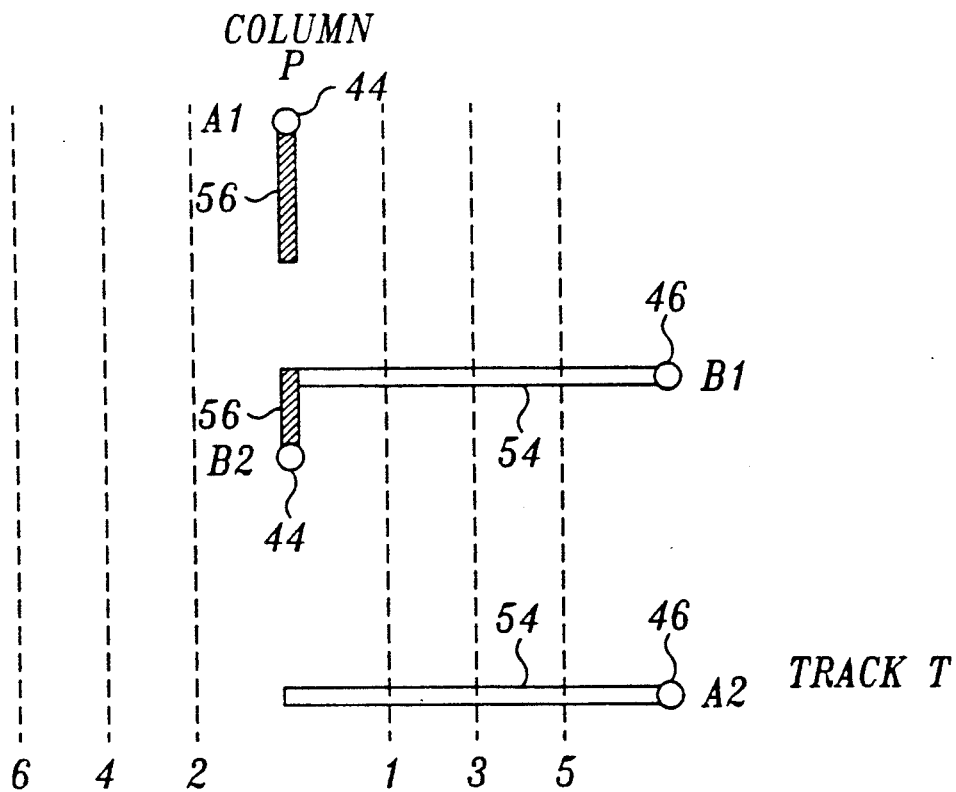
FIG. 7 schematically illustrates alternating vertical track sequence from left to right to determine an appropriate vertical column for interconnecting two horizontal tracks.
Figure 13:
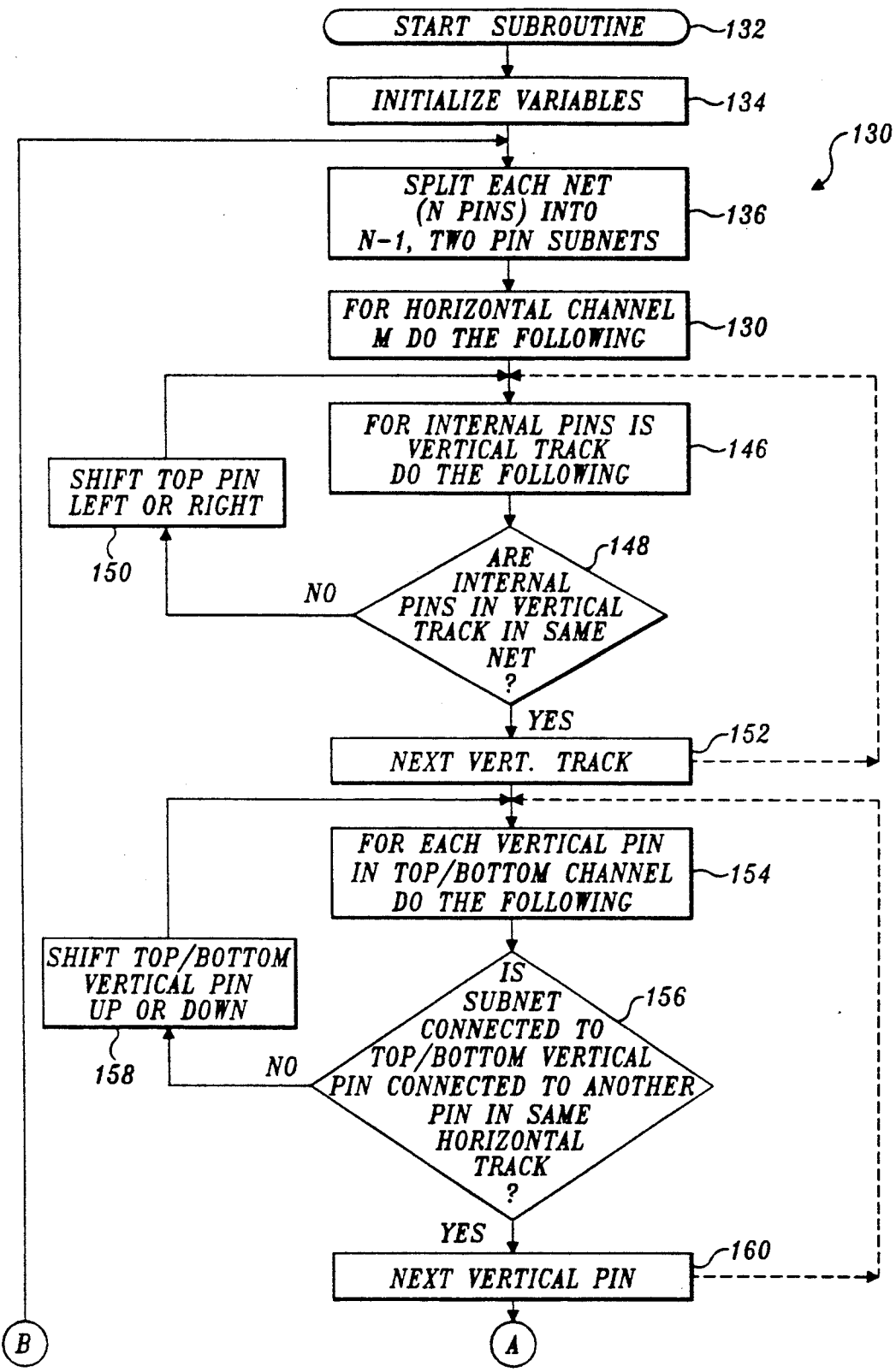
FIGS. 13 and 13A through 13C are portions of a flow chart showing the steps of a subroutine for horizontal channel routing in accordance with the present invention.
Figure 13A:
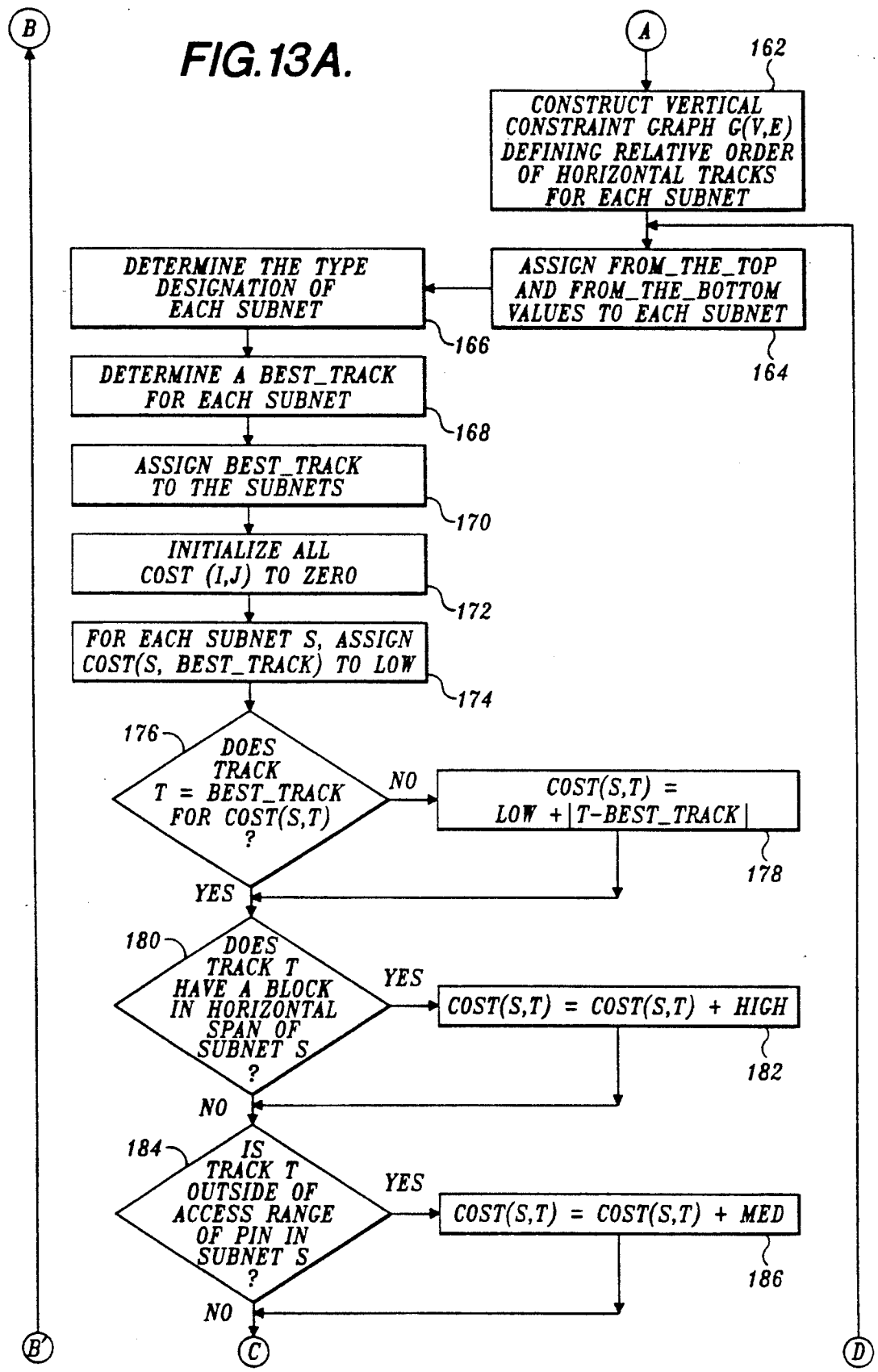
Figure 13B:
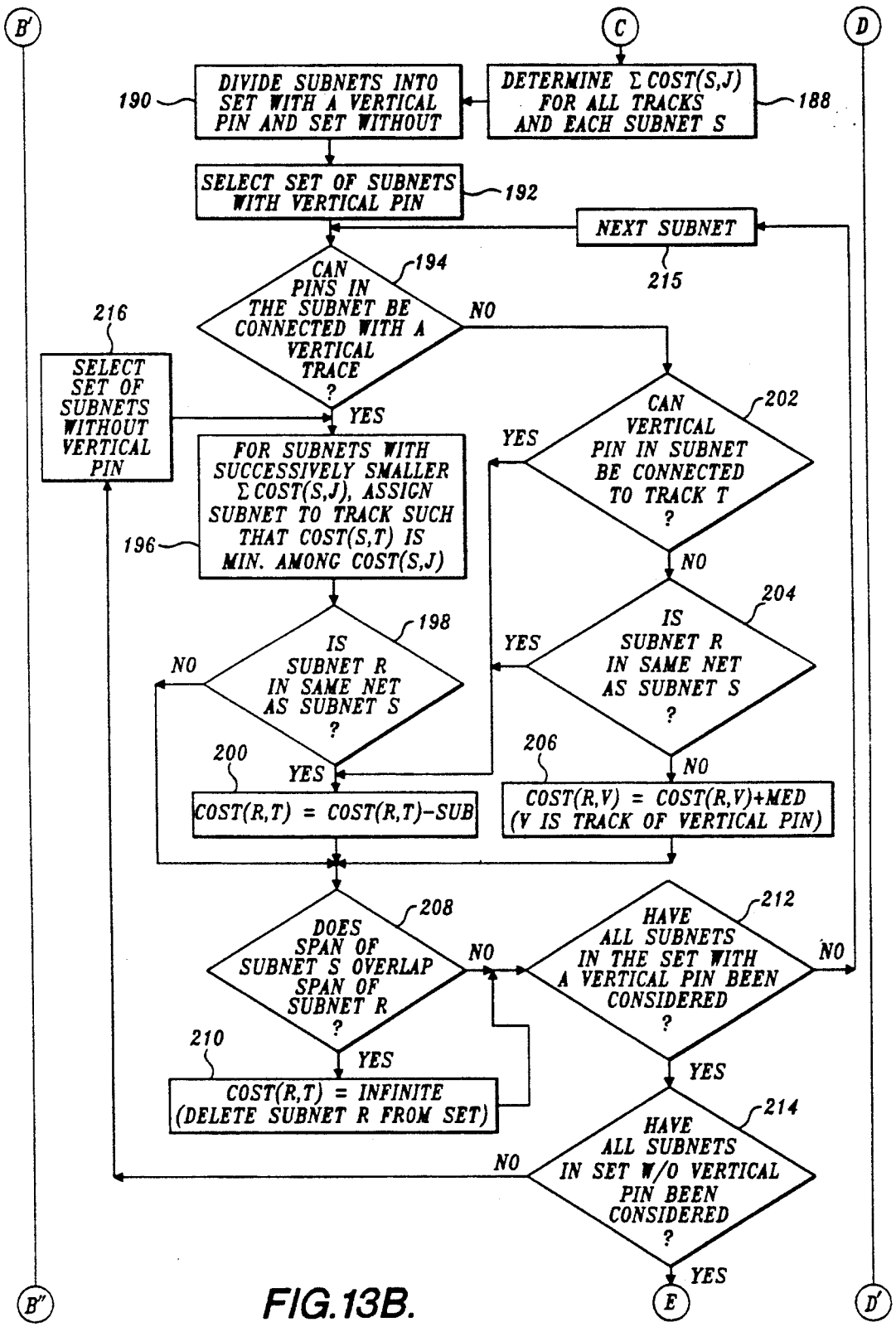
Figure 13C:
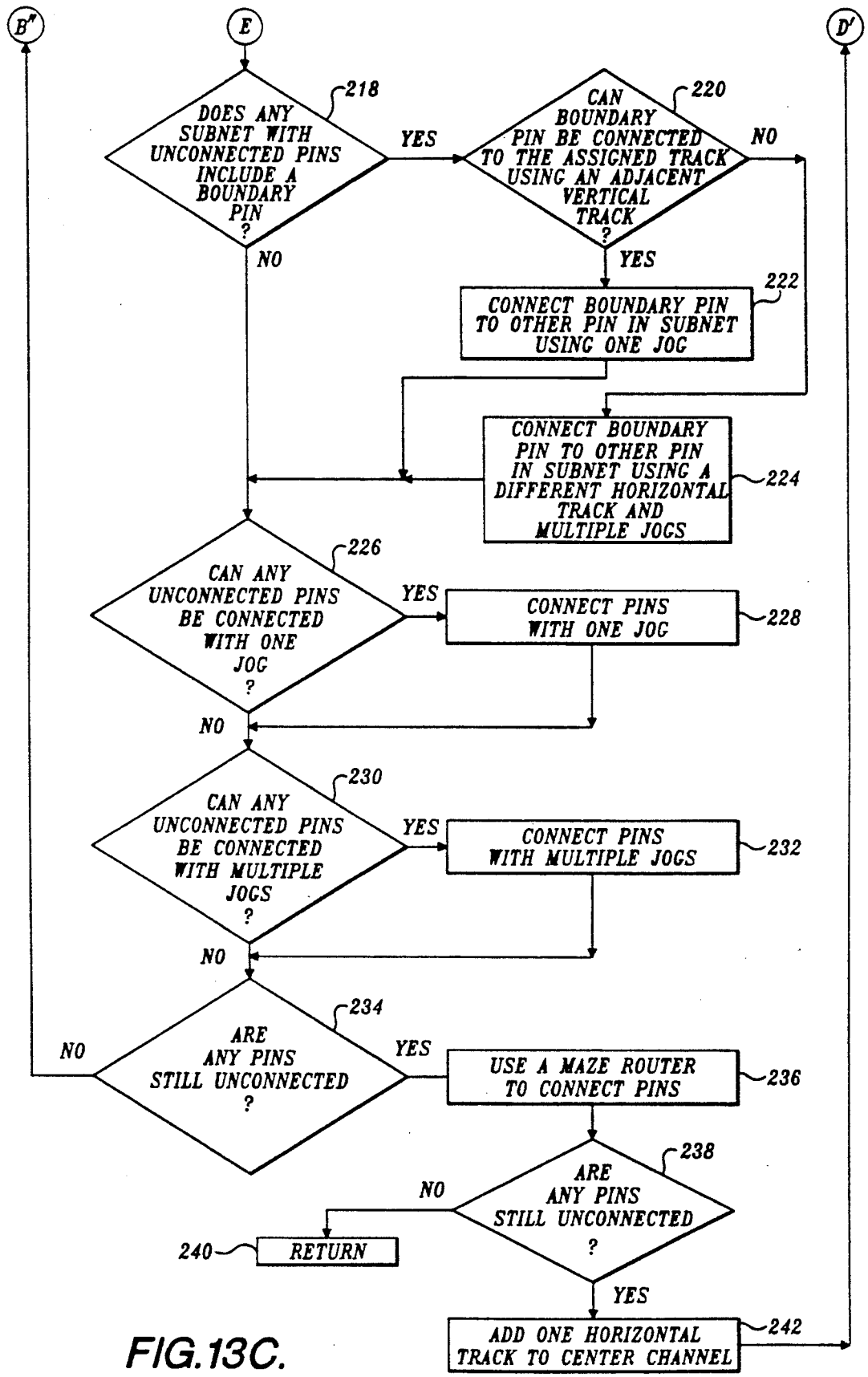

Finally, when all subnets without a vertical pin have been evaluated, the subroutine proceeds with a decision block 218 as shown in FIG. 13C. In this decision block, an inquiry determines whether any subnet remains with unconnected pins that includes a boundary pin. If so, a decision block 220 determines whether the boundary pin can be connected to an assigned track T using an adjacent vertical track. For example, assume subnet S is the unconnected subnet comprising an unconnected pin A1. Further, assume track T is the horizontal track where pin A1 resides, column P is the vertical track where pin A1 resides, and subnet S uses track T. A path using one jog or dogleg, generally as shown in FIG. 6, can connect pin A1 to track T. FIG. 6 merely presents an example illustrating how a single jog is used to connect the pins designated A1 and A2, thereby avoiding the connection between the internal pins designated B1 and B2. To select an appropriate path incorporating one jog, vertical tracks are preferably tried in alternating sequence from right to left on each side of one of the pins to be connected using the one jog path. For example, as shown in FIG. 7, the path illustrated in FIG. 6 is developed by selecting a vertical track 1 as the first option for creating a one jog interconnection path between the pins designated A1 and A2. Assuming that another subnet belonging to a different net interfered with the use of vertical track 1, the next option would be a vertical track 2, followed by a vertical track 3. Using this alternating sequence for selecting the vertical track to make a one jog connection, the method ensures that the closest available vertical track is selected. Selecting the first available vertical track by sequentially trying vertical tracks in only one direction, either left or right of the pin in question might result in a vertical track being selected that is much farther away from that pin than necessary.

Figure 9A:
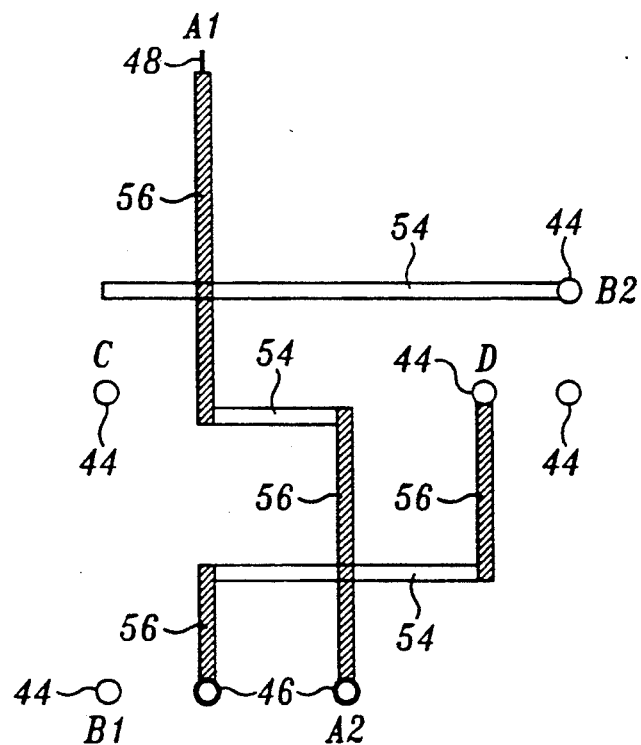
FIG. 9A schematically illustrates an initial interconnection of two pins that blocks interconnection of two other pins.
Figure 9B:
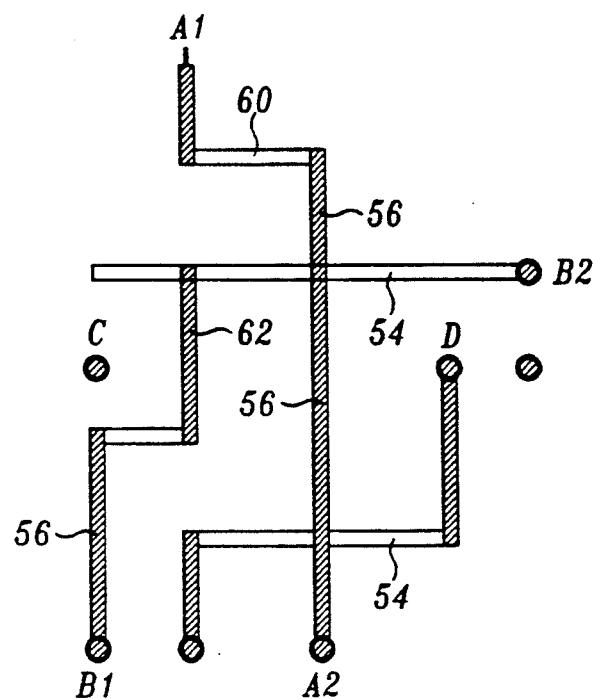
FIG. 9B shows how the initial interconnection of two pins in FIG. 9A is modified to permit interconnection of the two other pins in the Figure.

Accordingly, block 222 connects the boundary pin to the other pin in the subnet using the first available one jog. If a one jog path used to interconnect a top boundary pin with a bottom boundary pin includes a horizontal track that is generally close to tracks where internal pins are disposed, as shown in FIG. 9A, the horizontal track is shifted vertically so that it does not interfere with the internal pins. In FIG. 9A, top boundary pin 48, designated A1, is connected by a single jog path that includes a horizontal track 54'. However, horizontal track 54' interferes with the interconnection of two internal pins 44, designated B1 and B2. By shifting the horizontal interconnection vertically upward to a horizontal track 60 as shown in FIG. 9B, a vertical track segment 62 can be used for interconnecting pins B1 and B2 in combination with horizontal track 54, producing a usable single jog path.

Figure 8:
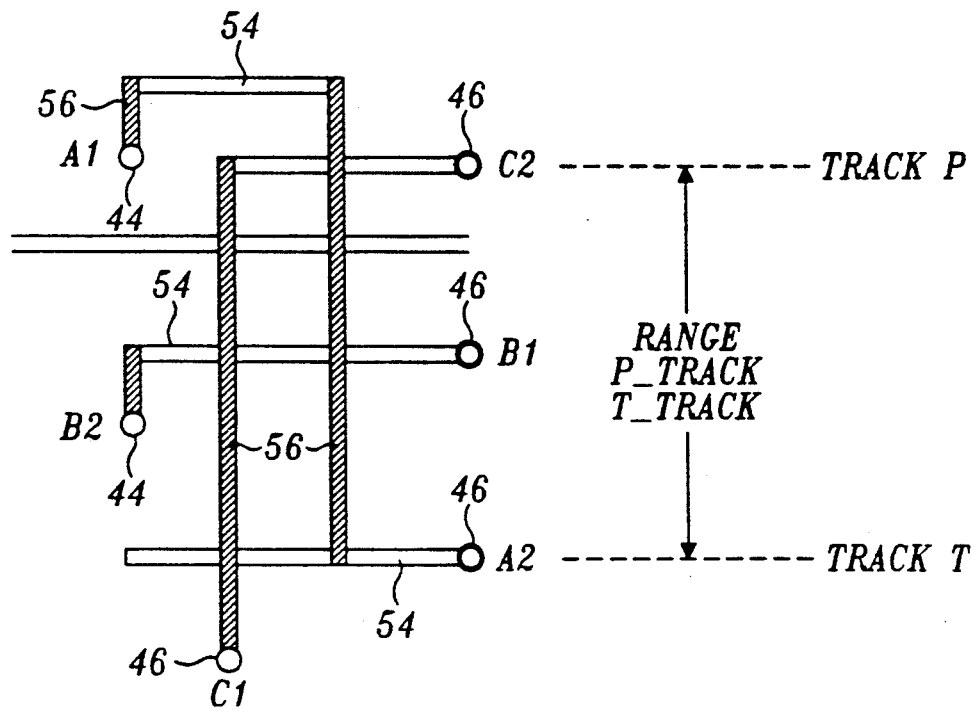
FIG. 8 schematically shows the use of horizontal tracks outside the range of two pins, for interconnection of the pins.

If the boundary pin cannot thus be connected, a block 224 connects the boundary pin to the other pin comprising its subnet using a different horizontal track and multiple jogs, as illustrated in FIG. 8. In this Figure, vertical pin 46, designated A2, is connected with internal pin 44 designated A1, using two vertical tracks 56 and two horizontal tracks 54, in a multiple jog path. It should be noted that the multiple jog path illustrated in this Figure extends outside a range P_TRACK and thereby avoids interference with subnets C1, C2, and B1, B2. Following blocks 222 and 224 (or as a result of a negative determination in decision block 218), a decision block 226 determines whether any unconnected pins of subnets yet remain that can be connected with one jog. If so, block 228 provides for connecting the pins with one jog, substantially as shown in FIGS. 6 or 9B. Otherwise, a decision block 230 determines whether any unconnected pins of subnets can be connected with multiple jogs. If so, a block 232 connects those pins with multiple jogs, generally as represented in FIG. 8.

Following block 232 (or as a result of a negative determination in decision block 230), a decision block 234 determines if any pins of subnets still remain unconnected. If so, a conventional maze router is used to connect those pins as provided in a block 236. Those of ordinary skill in the art will appreciate that maze routing techniques are well known, and are readily implemented for connecting any remaining pins if such connections are generally possible. Interconnections made with the maze router tend to be much more complex and to use longer paths, compared to interconnections made according to the preceding steps in the method.

Should any pins still remain unconnected following use of the maze router, as determined in a decision block 238, a block 242 adds an additional horizontal track to center routing channel 40. After adding the additional horizontal track, the logic returns back to block 166 on FIG. 13A and repeats the succeeding steps already described above. On the other hand, if the result of the inquiry in decision block 238 is negative, indicating that all pins (i.e., subnets) have been properly connected, a block 240 returns from subroutine 130 to a decision block 316 in a main program 300, as shown in FIG. 12. As noted above, each successive horizontal channel is thus routed using the steps described for subroutine 130, until all horizontal routing channels have been completed.

Following the logical rotation of multichip module 20, successive calls to the subroutine route subnets in the previous vertical channels, which are now treated as horizontal routing channels. Assignments of the boundary pins (i.e., vertical tracks through the boundary pins) to a particular subnet carried out during the initial routing of the horizontal channels (prior to the logical rotation of the multichip module), are now treated as temporary, since the previous boundary pins are now treated as vertical pins in the routing channel being processed following the logical rotation of the multichip module. After all subnets in the last channel are routed, all pins comprising subnets in multichip module 20 will have been assigned interconnecting tracks in a relatively efficient manner that makes maximum use of the area between pads 28 and boundaries 30 and 32 of ICs 22 for making the interconnections, thereby minimizing the size of the central routing channels between pads of adjacent ICs.

Figure 10:
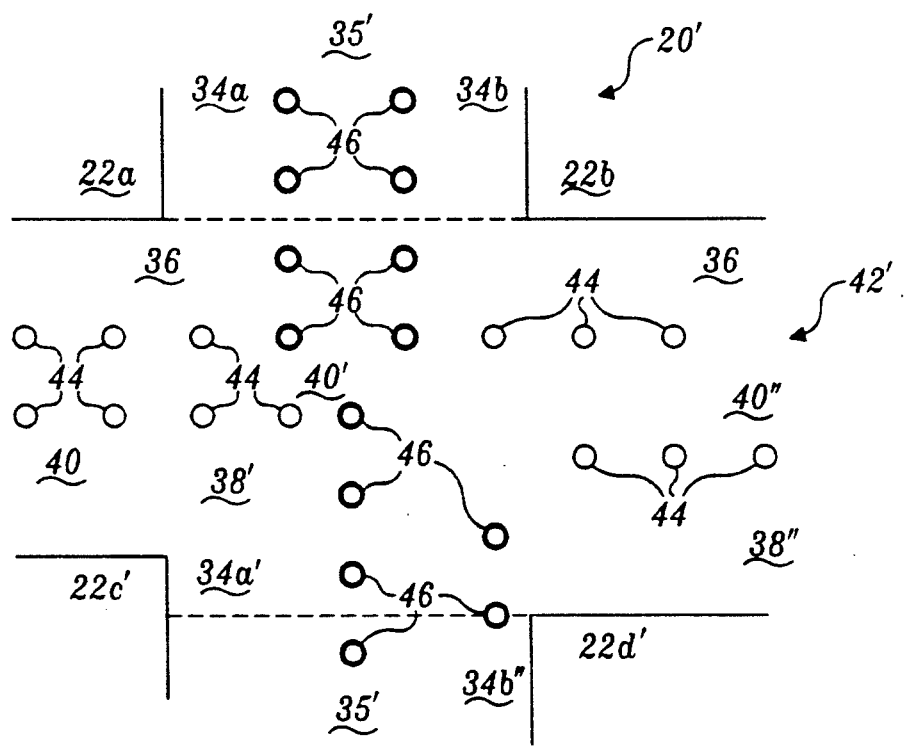
FIG. 10 is a schematic illustration of a portion of a multichip module in which the internal pins and vertical pins in a crossover area are nonaligned within the vertical and horizontal routing channel, due to nonalignment of the ICs comprising the multichip module.

The method for routing a multichip module can also be applied to interconnecting pins for ICs in a multichip module having unaligned boundaries and internal pins that are not aligned along horizontal and vertical tracks, generally as shown in FIG. 10 in respect to a multichip module 20'. Only a portion of multichip module 20' is shown that illustrates the asymmetrical distribution of ICs 22c' and 22d', in respect to ICs 22a and 22b. As a result of the lack of symmetry and alignment in positioning the ICs, a horizontal routing channel 42' includes a central routing channel 40', which includes a jog where it defines a crossover region in combination with a vertical routing channel 35'. To the right of the crossover region, a displaced central routing channel 40" is formed. Similarly, vertical routing channel 35' includes side routing channels 34a' and 34b' that are shifted to the right in respect to side channels 34a and 34b. However, the method of the present invention is carried out in substantially the same fashion as explained above.

Figure 11B:
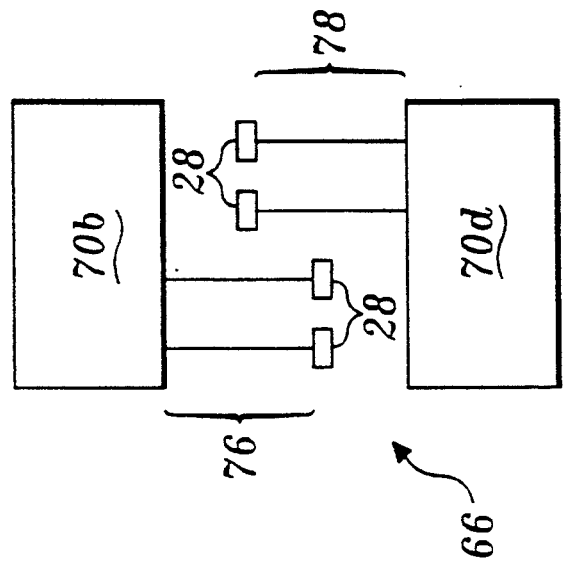
FIGS. 11A and 11B schematically show parts of a multichip module wherein ICs are mounted so that their top and bottom routing channels overlap.
Figure 11A:
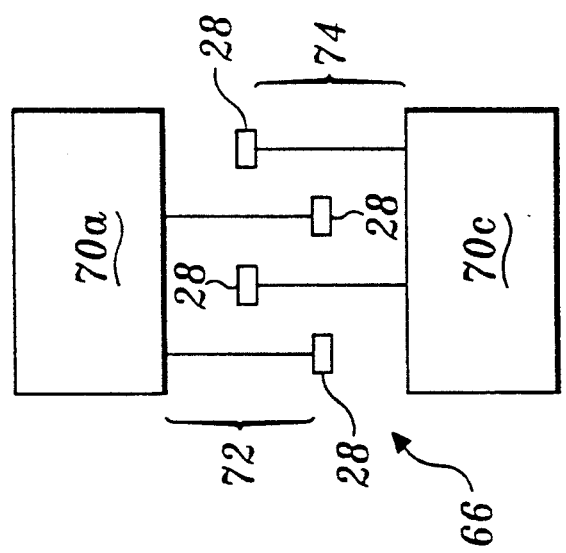

This method is also applicable to a multichip module 66, portions of which are shown in FIGS. 11A and 11B.

In multichip module 66, ICs 70a and 70c are disposed adjacent each other and include pads 28, which generally overlap in the space between the ICs, to define a top routing channel 72 overlapping a bottom routing channel 74. In multichip module 66, there is no central routing channel between the pads of the adjacent ICs.

Similarly, in FIG. 11B, instead of being interspersed in overlapping relationship, as shown in FIG. 11A, pads 28 are configured in overlapping pairs, defining a top routing channel 76 between pads 28 and an associated IC 70b, and an overlapping bottom routing channel 78 between pads 28 and a corresponding IC 70d. Since the present method does not specifically require a central routing channel, other than to provide additional tracks as indicated in block 242 (FIG. 13C), multichip module 66 can instead accommodate additional tracks as necessary by simply shifting the multichip modules further apart, so that the extent of overlap of top routing channel 72 and bottom routing channel 74, and of top routing channel 76 and bottom routing channel 78 is reduced.

Figure 14:
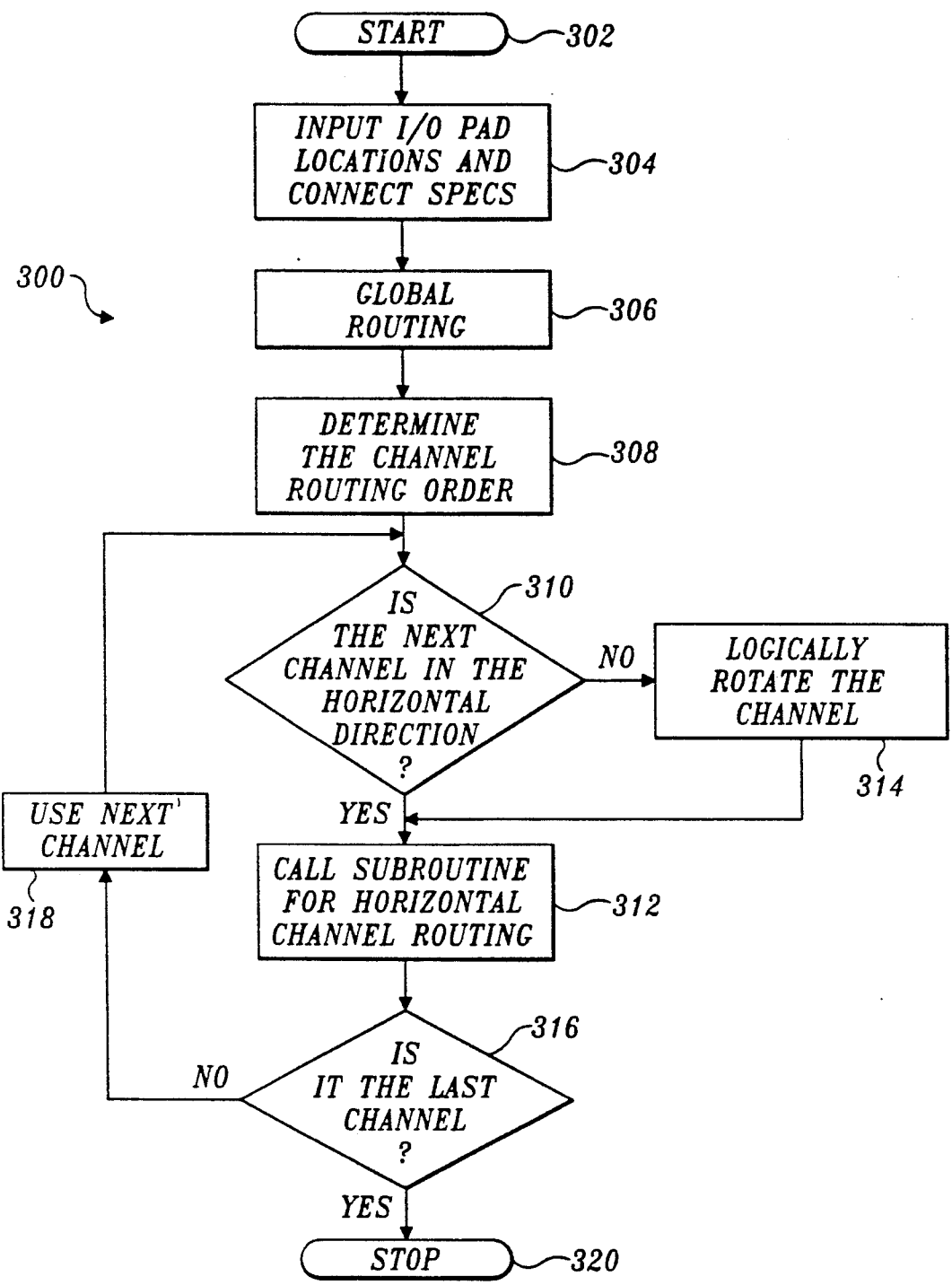
FIG. 14 is a flow chart of the main program used in a second embodiment of the present invention.
Figure 15:
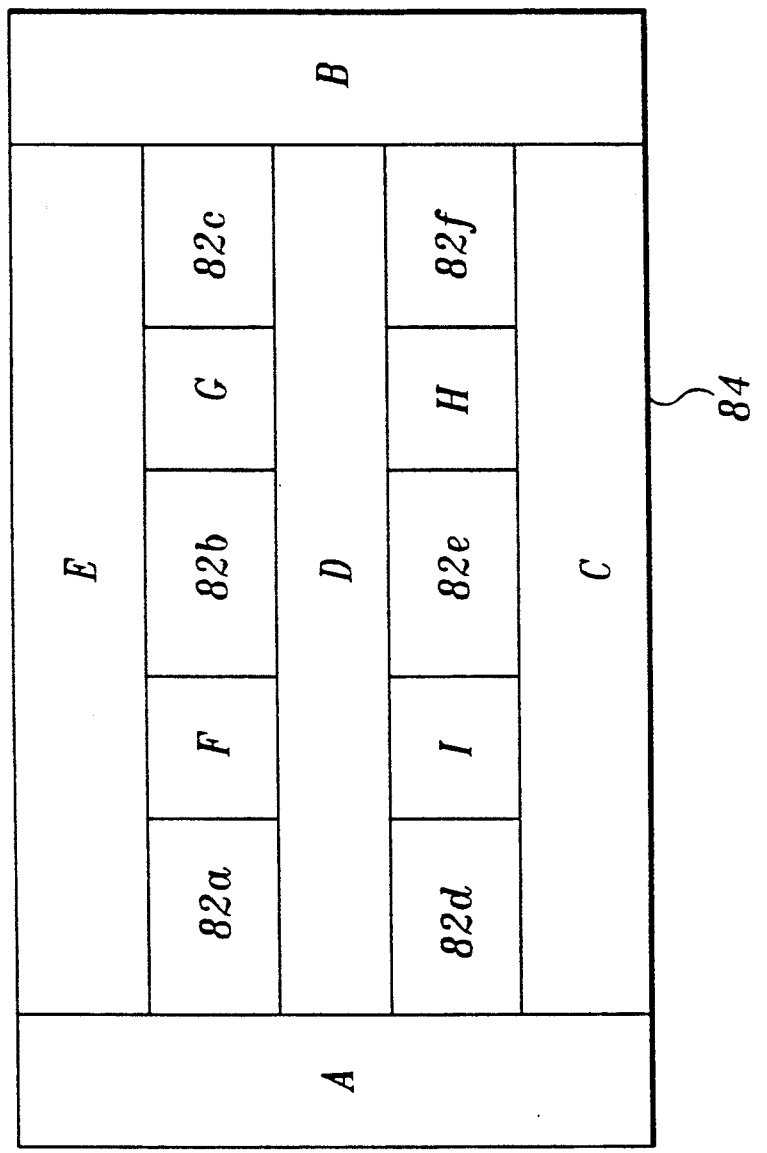
FIG. 15 is a schematic block diagram illustrating the division of a multichip module into contiguous sections for routing interconnections in accordance with the second embodiment of the present invention.

A further embodiment of the method is defined by a main program 300, shown in the flow chart of FIG. 14. This embodiment begins with a start block 302 and, like the first embodiment, includes a block 304 for providing data defining input/output pad locations and connection specifications for each of the pads associated with each of the ICs on the multichip module. Likewise, a global routing procedure in a block 306 is used to determine the vertical and horizontal channels through which specific pins are to be interconnected in nets of common electrical continuity. However, this embodiment differs from the first embodiment beginning in a block 308, wherein the routing order of the channels is defined for the multichip module. In this step, the vertical and horizontal channels are defined in respect to contiguous areas. Tracks assigned in these areas are not rerouted following logical orientation of the multichip module. For example, the division of a multichip module 80 into contiguous horizontal and vertical routing channel sections is provided in FIG. 15. A multichip module 80 is shown that includes six ICs, 82a-82f, mounted on a substrate 84. The pads and pins associated with each of the ICs are intentionally omitted from FIG. 15 in order to simplify the diagram. Generally, all of the space surrounding ICs 82 on substrate 84 is available for routing interconnections between pins that are in turn electrically connected to the internal circuitry of ICs 82 through pads 28 (not shown) as described above in respect to multichip module 20. Multichip module 80 is divided into a plurality of vertical and horizontal routing channels A through I, as shown in the Figure. The alphanumeric sequence of these routing channels does not necessarily reflect their routing order. Typically, the routing channels with the higher pin density are routed before channels with lower pin density.

Referring back to FIG. 14, after the channel routing order has been determined in block 308, the program proceeds to a block 310 that determines if the next channel in the routing order priority is aligned in the horizontal direction. Assuming that it is (which would not be the case for routing channel A), the subroutine for horizontal routing is called in a block 312. If the routing channel is not oriented in the horizontal direction, a block 314 logically rotates the channel, such that if it were previously vertical, e.g., as is routing channel A, it is now treated as a horizontal channel. Thereafter, the subroutine for horizontal channel routing is called in block 312. Following block 312, a decision block 316 determines if the last channel has been routed, and if not, proceeds to a block 318 which sets the next routing channel to be considered. After block 318, main routine 300 proceeds back through the loop, starting each time with decision block 310.

After the last channel has been routed, as determined by decision block 316, the main program stops at a block 320. Thus, the second embodiment of the present method simply treats each section of multichip module 80 that is available for routing as a separate actual (or logically oriented) horizontal routing channel and proceeds to route interconnections in that section. After all of the channel sections have thus been routed by repetitively calling the subroutine, all pins in subnets on multichip module 80 are interconnected, making maximum use of all of the routing area between ICs 82. In this approach, boundary pin track assignments are not temporary, but instead are maintained as other adjacent routing channels are processed.

While the present invention has been disclosed in respect to several preferred embodiments, those of ordinary skill in the art will appreciate that further modifications may be made to the invention without departing from the scope of the claims that follow. Accordingly, the scope of the invention should be entirely determined by reference to the claims.

The invention in which an exclusive property or privilege is claims is defined as follows:

1. A method for interconnecting a plurality of integrated circuits that are mounted on a substrate to form a multichip module so as to maximize a density of the integrated circuits on the substrate, terminals on each integrated circuit being electrically connected to a plurality of pads disposed in a spaced apart array within routing channels defined between boundaries of adjacent integrated circuits, each routing channel including a central routing channel defined between the pads of the adjacent integrated circuits, and side routing channels defined between the pads and the adjacent boundaries of the integrated circuits, crossover regions being defined where the routing channels transversely cross each other, the pads including a plurality of pins that must be interconnected, the method comprising the steps of:
   a. defining a plurality of two pin subnets that must be interconnected;
   b. assigning each subnet to a track within the routing channels so as to maximize the use of the side routing channels and minimize the use of the central routing channels, subject to a plurality of constraints, including:
      i. subnets are not assigned to a track if such assignment would cause overlap with subnets that are not to be interconnected;
      ii. jogged interconnection of pins in each subnets is accomplished with a minimum number of jogs; and
   c. additional tracks are added to the central routing channel only if required to interconnect pins in any subnet remaining unconnected after step (b).

2. A method for electrically interconnecting a plurality of integrated circuits that are attached to a substrate forming a multichip module, the integrated circuits being interconnected by conductive traces defined in a plurality of layers applied to the substrate outside boundaries of the integrated circuits, the conductive traces extending along generally orthogonal vertical and horizontal tracks in different layers, each integrated circuit having a plurality of terminals that are electrically connected to a corresponding plurality of pads disposed in a spaced apart array outside the boundaries of that integrated circuit, routing channels between the integrated circuits including variable width central routing channels defined between the pads of adjacent integrated circuits and side routing channels defined between the pads and the boundaries of the integrated circuits, the method being applied to interconnect the pads of the plurality of integrated circuits so as to minimize the width of the central routing channels between the adjacent integrated circuits on the multichip module, the method comprising the steps of:
   a. defining a plurality of pins to be electrically interconnected, each pin comprising a point on one of the pads;
   b. defining a plurality of nets, each net comprising the pins that are to be electrically interconnected;
   c. dividing each net into a plurality of two-pin subnets;
   d. for each routing channel that is horizontal, moving horizontally in a preferred direction to successive vertical tracks and at each vertical track, assigning a specific horizontal track to each subnet that has one pin in that vertical track and another pin in a vertical track that is offset in the preferred direction, giving preference to assigning horizontal tracks in the side routing channels, so as to minimize violations of the following constraints:
      i. subnets of different nets that lie along a common vertical track can not lie in overlapping horizontal tracks;
      ii. subnets of different nets that lie along a common vertical track can not overlap along that common vertical track;
   e. for subnets including pins that can not be interconnected without violating the constraints in steps (d)(i) and (d)(ii), either modifying the position of at least one of the pins comprising such subnets to avoid violation of said constraints, or interconnecting the pins of such subnets using additional horizontal and vertical tracks to form a jogged path, subject to the constraint of assigning horizontal and vertical tracks to said pins so that pins comprising each subnet are interconnected using a minimum number of additional horizontal and vertical tracks;
   f. logically orienting the multichip module so that the horizontal tracks are treated as vertical tracks and the vertical tracks are treated as horizontal tracks; and
   g. repeating steps (d) and (e) in respect to the logical orientation in step (f), whereby the vertical tracks are treated as horizontal tracks and the horizontal tracks are treated as vertical tracks while repeating steps (d) and (e).

3. The method of claim 2, wherein a crossover region is defined where two orthogonal routing channels cross, and wherein the crossover region includes boundary pins aligned generally horizontally along opposite edges of one of the two routing channels where it crosses the other routing channel, further including the step of temporarily assigning a vertical track aligned with one of the boundary pins to each subnet passing over the boundary pins.

4. The method of claim 3, wherein after logically orienting the multichip module, each subnet having the temporarily assigned vertical track that is aligned with one of the boundary pins retains its previously assigned horizontal track, but is subject to reassignment to a different track through another boundary pin, in accordance with steps 1(d) and 1(e).

5. The method of claim 3, wherein a "cost" is associated with each horizontal track that can be assigned to each subnet, based upon the conformance of the assignment to the constraints in steps 1(d) and 1(e), and wherein the step of assigning the horizontal track comprises the step of selecting the horizontal track that minimizes the cost.

6. The method of claim 3, wherein the step of assigning horizontal tracks to subnets in step 1(e) includes the step of shifting pins disposed within the crossover region horizontally to avoid overlap of vertical tracks for subnets of different nets.

7. The method of claim 3, wherein step 1(e) includes the step of shifting pins that are disposed in the crossover region and vertically aligned to avoid overlap of horizontal tracks assigned to subnets of different nets.

8. The method of claim 2, wherein assigning horizontal tracks in step 1(e) includes the step of positioning the pads so that the side routing channels overlap between adjacent integrated circuits.

9. The method of claim 2, wherein step 1(d) includes the step of alternating the preferred direction in first one direction and then in an opposite direction so that the sequence of vertical tracks extends first in said one direction and then in said opposite direction, thereby reducing a total track length required for interconnection of the pins comprising at least some of the subnets.

10. The method of claim 2, wherein step 1(e) includes reassigning horizontal tracks to subnets to enable interconnection of pins comprising subnets that could not otherwise be interconnected without violating the constraints.

11. The method of claim 2, wherein step 1(e) is effected by a maze routing procedure.

12. A method for interconnecting a plurality of integrated circuits that are mounted on a substrate to form a multichip module so as to minimize spacings between the integrated circuits on the multichip module, terminals on each integrated circuit being electrically connected to a plurality of pads disposed in a spaced apart array within routing channels that extend both vertically and horizontally between boundaries of adjacent integrated circuits, each routing channel including a central routing channel defined between the pads of adjacent integrated circuits, and side routing channels defined between the pads and the boundaries of the integrated circuits, the vertical and horizontal routing channels crossing in crossover regions that include vertical pins, which are aligned vertically, and boundary pins disposed along the edges of the crossover region, the routing channels including a plurality of internal pins that are disposed outside of the crossover region, the vertical pins and the internal pins being electrically connected to the pads, a plurality of horizontal tracks and a plurality of vertical tracks disposed in the routing channels being available to interconnect the internal and vertical pins in a plurality of nets, each net including vertical and internal pins connected in common, the method comprising the steps of:

a. dividing a total number of pins, N, in each net, into N-1 subnets, each subnet comprising two pins that must be interconnected;

b. determining the routing channels for each subnet, including the crossover regions, if any, through which the two pins comprising the subnets must be interconnected;

c. for any two internal pins not in the same net that lie in a common vertical track, shifting at least one of said two internal pins horizontally by at least one vertical track;

d. for any two vertical pins not in the same net that lie in a common horizontal track, shifting at least one of the two vertical pins vertically closer to a center of the side channel in which that vertical pin is disposed;

e. for each horizontal routing channel, determining a preferred relative order in which the horizontal tracks contained therein should be assigned to the subnets comprising at least one pin disposed within that horizontal routing channel, from one boundary of the horizontal routing channel to the other, so that subnets of different nets that lie in a common vertical track in the routing channel do not lie in overlapping horizontal tracks and so that subnets of different nets that lie in a common vertical track within the routing channel do not overlap along that common vertical track;

f. assigning a horizontal track to each of the subnets within each horizontal routing channel so as to minimize a cost associated with that assignment, where the cost is less for horizontal tracks that are in the side routing channels and greater for horizontal tracks that are in the center routing channels;

g. interconnecting pins comprising subnets not yet connected following step (f) by using additional vertical and horizontal tracks to form a jogged interconnect pattern that avoids interconnecting to subnets of different nets;

h. logically orienting the multichip module so that horizontal and vertical routing channels are treated as vertical and horizontal and vertical routing channels, respectively, and horizontal and vertical tracks are treated as vertical and horizontal tracks, respectively; and i. repeating steps (e) through (g) in respect to the logical orientation of the multichip module in step (h).

13. The method of claim 12, wherein the step of determining the preferred relative order comprises the step of constructing a vertical constraint graph, G(V,E), wherein V represents a set of all the subnets considered and E is a set of directed edges, each directed edge having a subnet $V_i$ that includes a pin in a horizontal track above a horizontal track in which a pin of a subnet $V_j$ is disposed with no other pin disposed between the pin of subnet $V_i$ and the pin of subnet $V_j$, thereby defining a relative order $V_i$, $V_j$ in respect to those subnets.

14. The method of claim 12, wherein the step of assigning horizontal tracks comprises the step of developing a cost matrix having M rows and N columns, where M is the number of subsets being considered and N is the number of horizontal tracks in the horizontal routing channel.

15. The method of claim 14, wherein a cost associated with assigning a specific horizontal track in the horizontal routing channel to a specific subnet comprises an element of the cost matrix and wherein the cost for each element of the cost matrix is a sum of a first quantity and a second quantity, the first quantity being selected to give a preference to assigning a horizontal track disposed in the side routing channels to the specific subnet, and the second quantity being set equal to one of a plurality of predetermined values having successively smaller relative magnitudes, as follows:
  a. a first value that is the largest of the predetermined values is used, if assigning the specific track for the subnet would cause an overlap with the subnet of a different net;
  b. a second value that is the next smaller predetermined value than the first value is used, if assigning the specific track for the subnet would cause conflicts with subnets already assigned the specific horizontal track;
  c. a third value that is the next smaller predetermined value than the second value is used, if the specific horizontal track can not be accessed by the pins comprising the subnet; and
  d. a fourth value that is the smallest of the predetermined values is used, if the specific track can be assigned to the subset without conflict with other subnets.

16. The method of claim 15, wherein the first quantity varies depending upon the total number of horizontal tracks available in the horizontal routing channel and the location of the pins comprising the subnet.

17. The method of claim 15, wherein the plurality of predetermined values are selected to weight the assignment of the horizontal track to each subnet to achieve the minimum cost for the horizontal track assigned to each subnet.

18. The method of claim 12, further comprising the step of reassigning horizontal tracks to subnets in order to connect pins comprising subnets that have not been successfully connected after step 11(i).

19. The method of claim 12, further comprising the step of adding a horizontal track to enable interconnection of pins comprising subsets that have not been successfully connected after step 11(i).

20. The method of claim 12, wherein the step of determining the preferred relative order includes the steps of selecting a starting pin and alternating directions while moving to successive vertical tracks, first in one direction, and then in the opposite direction, so that for each subnet having a pin in one vertical track and another pin in a different vertical track that is offset in the last direction moved, the preferred order of the subnet is determined.

21. The method of claim 12, further comprising the step of mounting the integrated circuits on the substrate so as to shift the routing channels between two of the integrated circuits out of alignment with the routing channel disposed between two other adjacent integrated circuits, thereby increasing the number of horizontal tracks available for assignment to the subnets.

* * * * *

UNITED STATES PATENT AND TRADEMARK OFFICE
CERTIFICATE OF CORRECTION

PATENT NO. : 5,295,082
DATED : March 15, 1994
INVENTOR(S) : K.-C. Chang et al.

It is certified that error appears in the above-indentified patent and that said Letters Patent is hereby corrected as shown below:

| COLUMN | LINE | |
|--------|------|---|
| 5 | 36 | after "multichip" insert --module-- |
| 9 | 54 | "vertically" should read --vertical-- |
| 10 | 52 | "The" (second occurrence) should read --THE-- |
| 11 | 61 | "$BEST_{13}$" should read --BEST__-- |

Signed and Sealed this

Ninth Day of August, 1994

Attest:

BRUCE LEHMAN

*Attesting Officer*   *Commissioner of Patents and Trademarks*